(12) United States Patent
Ninose et al.

(10) Patent No.: US 10,204,003 B2
(45) Date of Patent: Feb. 12, 2019

(54) MEMORY DEVICE AND STORAGE APPARATUS

(71) Applicant: Hitachi, Ltd., Tokyo (JP)

(72) Inventors: Kenta Ninose, Tokyo (JP); Takuji Itou, Tokyo (JP); Fumio Yoshioka, Tokyo (JP); Takashi Tsunehiro, Tokyo (JP); Go Uehara, Tokyo (JP); Shigeo Homma, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 812 days.

(21) Appl. No.: 14/425,556

(22) PCT Filed: Aug. 27, 2014

(86) PCT No.: PCT/JP2014/072428
§ 371 (c)(1),
(2) Date: Mar. 3, 2015

(87) PCT Pub. No.: WO2016/030992
PCT Pub. Date: Mar. 3, 2016

(65) Prior Publication Data
US 2016/0259675 A1  Sep. 8, 2016

(51) Int. Cl.
*G11C 7/00* (2006.01)
*G06F 11/07* (2006.01)
(Continued)

(52) U.S. Cl.
CPC ........ *G06F 11/079* (2013.01); *G06F 11/0727* (2013.01); *G06F 11/0751* (2013.01);
(Continued)

(58) Field of Classification Search
CPC ....... G11C 29/52; G11C 29/765; G11C 29/76; G11C 29/42; G11C 29/44; G11C 13/0004;
(Continued)

(56) References Cited

U.S. PATENT DOCUMENTS 8,041,991 B2   10/2011  McKean
8,195,978 B2 *  6/2012  Flynn .................. G06F 11/1008
                                        714/6.1
(Continued)

FOREIGN PATENT DOCUMENTS

JP   58-130500 A   8/1983
JP   2004-272476 A  9/2004
(Continued)

*Primary Examiner* — Gene Auduong
(74) *Attorney, Agent, or Firm* — Volpe and Koenig, P.C.

(57) ABSTRACT

A failure region is specified when a failure occurs in a non-volatile semiconductor memory. When a device controller reads data stored in a specific page in a plurality of non-volatile semiconductor memories to detect an uncorrectable error (UE) of the data stored in the specific page, the device controller executes a diagnosis process including specifying a specific storage circuit that is a storage circuit including the specific page, reading data stored in a part of blocks of the specific storage circuit, and specifying, on the basis of a result of reading data stored in the block, a failure region in the specific storage circuit.

14 Claims, 34 Drawing Sheets

(51) Int. Cl.
  *G11C 29/00*   (2006.01)
  *G11C 29/52*   (2006.01)
  *G11C 11/56*   (2006.01)

(52) U.S. Cl.
  CPC ............ *G11C 29/52* (2013.01); *G11C 29/76*
      (2013.01); *G11C 29/765* (2013.01); *G11C*
      *11/5678* (2013.01); *G11C 11/5685* (2013.01)

(58) Field of Classification Search
  CPC . G06F 11/0751; G06F 11/0727; G06F 11/079
  USPC .... 365/201, 185.09, 185.22, 230.06, 185.11,
                                         365/185.12
  See application file for complete search history.

(56)             References Cited

U.S. PATENT DOCUMENTS 8,832,528 B2 *  9/2014  Thatcher ............... G06F 11/073
                                                      714/758
  9,304,853 B2 *  4/2016  Thatcher ............... G06F 11/073

FOREIGN PATENT DOCUMENTS

JP      2013-037631  A    2/2013
  WO      2013/046463  A1   4/2013
  WO      2013/094041  A1   6/2013

* cited by examiner

Fig.6

WL #-Page # correspondence table  760

| # of WL | |
|---|---|
| 64 | |

| WL# | Page# |
|---|---|
| 0 | 0,1,4,5 |
| 1 | 2,3,8,9 |
| 2 | 6,7,10,11 |
| : | : |
| 63 | 250,251,254,255 |

Plane #-Block # correspondence table (example of 2 Planes in 1 Die)

| # of Plane | |
|---|---|
| 2 | |
| Plane# | Block# |
| 0 | 0,2,4,···,2046 |
| 1 | 1,3,5,···,2047 |

770b

Plane #-Block # correspondence table (example of 4 Planes in 1 Die)

| # of Plane | |
|---|---|
| 4 | |
| Plane# | Block# |
| 0 | 0,4,8,···,4092 |
| 1 | 1,5,9,···,4093 |
| 2 | 2,6,10,···,4094 |
| 3 | 3,7,11,···,4095 |

Fig.9

Page mapping management table 720

| LBA 723 | Logical page identifier 721 | Physical page identifier 722 |
|---|---|---|
| 0x0000 | 0 | 100 |
| 0x0000 | 1 | 500 |
| 0x0000 | 2 | Unallocated |
| ... | 100 | 300 |
| | ... | ... |
| | 1000 | Unallocated |
| | ... | ... |

Fig. 10

FMPK state management table 730

| | Item | Value |
|---|---|---|
| 841 | Block# | 0 |
| 842 | Status | Allocated |
| 843 | Total # of pages | 256 |
| 844 | In-use | 77 |
| 845 | Valid | 60 |
| 846 | Invalid | 17 |

840

| | Item | Value |
|---|---|---|
| 831 | Die# | 0 |
| 832 | Status | Good |
| 833 | # of defective blocks | 6 |
| 834 | # of allocated blocks | 762 |
| 835 | Total # of blocks | 4096 |
| | Block Management table | |

830

| | Item | Value |
|---|---|---|
| 821 | Chip# | 0 |
| 822 | Status | Good |
| 823 | # of defective Dies | 0 |
| 824 | Total # of Dies | 4 |
| | Die Management table | |

820

| | Item | Value |
|---|---|---|
| 811 | DMA# | 0 |
| 812 | Status | Good |
| 813 | # of defective chips | 0 |
| 814 | total # of chips | 4 |
| | Chip Management table | |

810

| Item | Value |
|---|---|
| DMA# | 31 |
| Status | Good |
| # of defective chips | 0 |
| total # of chips | 4 |
| Chip Management table | |

Fig.11

Failure address list 750

| Failed LBA 751 | Length 752 |
|---|---|
| 100 | 1 |
| 500 | 2 |
| 312 | 100 |
| .. | .. |
| .. | .. |
| | |
| | |

Fig.19

RG management table 620

| RG# | PDEV# | RAID level | PDEV classification | PDEV minimum capacity |
|---|---|---|---|---|
| 0 | 0,1,2,3 | RAID5 | FMPK | 1600G |
| 1 | 8,9,10,11,12,13,14,15 | RAID6 | FMPK | 800G |
| 2 | Unallocated | - | - | - |
| .. | .. | .. | .. | .. |
| 5 | 70,80,90,100 | RAID5 | SAS | 300G |
| .. | .. | .. | .. | .. |

LU management table 630

| LU# 631 | RG# 632 | Stripe size 633 | LU start address 634 | LU size 635 |
|---|---|---|---|---|
| 0 | 0 | 64KB | 0x000000000 | 100GB |
| 1 | 0 | 128KB | 0x100000000 | 200GB |
| 2 | 1 | 64KB | 0x000000000 | 50GB |
| .. | .. | .. | .. | .. |
| 5 | 2 | 512KB | 0x200000000 | 2TB |
| .. | .. | .. | .. | .. |

Fig.21

Virtual page mapping table 650

| VVOL# | Virtual page ID | Real page ID |
|---|---|---|
| 0 | 000 | 002 |
|  | 001 | 100 |
|  | 002 | Unallocated |
|  | 003 | 200 |
|  | .. | .. |
| 1 | 100 | 000 |
|  | 101 | 003 |
|  | 102 | 202 |
|  | 103 | Unallocated |
|  | .. | .. |
| .. | .. | .. |

Fig.22

Real page state management table 660

| POOL# | Real page ID | State |
|---|---|---|
| 0 | 000 | In use |
| | 001 | Not in use |
| | 002 | In use |
| | 003 | In use |
| .. | .. | .. |

PDEV management table 640

| PDEV# | Current user capacity | Initial user capacity | Start address | Terminal address |
|---|---|---|---|---|
| 0 | 800 | 1600 | aaaaaaaa | bbbbbbbb |
| 1 | 1600 | 1600 | cccccccc | dddddddd |
| 2 | 800 | 1600 | eeeeeeee | ffffffff |
| .. | .. | .. | .. | .. |
| 5 | 400 | 400 | | |
| .. | .. | .. | .. | .. |

MEMORY DEVICE AND STORAGE APPARATUS

TECHNICAL FIELD

The present invention relates to a memory device and a storage apparatus.

BACKGROUND ART

In recent years, as there is an increasing amount of data to be processed in a company, a storage apparatus comes to include a large number of memory devices, and the memory device increases in capacity year by year. In general, an HDD (Hard Disk Drive) is installed as a memory device; however, in place of the HDD, in recent years, attention is focused on a memory device (an SSD: Solid State Device, for example) having, as a memory medium, a non-volatile semiconductor memory (a flash memory, for example). Although the SSD is more expensive than the HDD, the SSD performs I/O process at an extremely high speed.

In the flash memory, a physical storage area is managed by a unit referred to as a "block", and the data is erased by such block. There is an upper limit on the number of times that the block is erased, and when the number of times of erasure increases, it may be difficult to write data into the flash memory or it is likely that an error occurrence rate of data written into the flash memory increases. That is, the flash memory has a life-span, and the SSD having a large number of flash memories also has a life-span. As refinement of a flash memory chip is developed, the flash memory chip comes to possess a large capacity, and on the other hand, reliability is decreased and there occurs an issue that die-by-die or chip-by-chip quality is not consistent, for example. The die of poor quality tends to increase an error occurrence rate and becomes unusable due to a failure even when the number of times of erasure is less than a predetermined number. When such a failure occurs in a plurality of dies, it is not possible to ensure a storage area which stores user data and there is no choice but to close the memory device. Thus, when an SSD becomes unusable at an earlier stage than a predetermined period, a replacement frequency may increase and a cost for purchase and maintenance of an SSD may occur.

For example, PTL 1 discloses a data recovery technology performed when a failure occurs in a block in an SSD. There is known a technology in which when, in a storage apparatus having a plurality of SSDs, a failure of a block in a certain SSD is detected, all data, including a failed block, in the SSD are rebuilt in a different SSD.

CITATION LIST

Patent Literature

[PTL 1] U.S. Pat. No. 8,041,991

SUMMARY OF INVENTION

Technical Problem

With the technology of PTL 1, when a failure occurs in a part of a non-volatile semiconductor memory in a memory device, the memory device is closed even in the presence of a large number of other available parts (a die or a chip of the memory), each having high quality. This results in a need for such a memory device to be replaced. As a capacity is increased in a memory device, an available capacity still remains to be large even when a failure occurs in a partial area. Therefore, the closing of the memory device for the partial failure results in a lot of wasting. With the occurrence of the failure, accordingly, there is a possibility of avoiding the closure of the memory device provided that a controller in the memory device inspects the whole non-volatile semiconductor memory to specify a failure region. However process for inspecting the whole non-volatile semiconductor memory causes a load to increase, resulting in performance degradation of the memory device.

Solution to Problem

To solve the above problem, a memory device according to an aspect of the present invention includes a plurality of non-volatile semiconductor memories, and a device controller that is coupled to the plurality of non-volatile semiconductor memories and coupled to a host apparatus which issues an instruction for accessing the plurality of non-volatile semiconductor memories. Each of the plurality of non-volatile semiconductor memories includes a plurality of storage circuits and a plurality of control circuits, the plurality of storage circuits are coupled to the device controller via the plurality of control circuits, respectively, each of the plurality of storage circuits includes a plurality of blocks, each block is a unit of erasure of data, each of the plurality of blocks includes a plurality of pages, each page is a unit of read and write of data, and the device controller is configured to, when the device controller reads data stored in a specific page in the plurality of non-volatile semiconductor memories to detect an uncorrectable error (UE) of the data stored in the specific page, execute a diagnosis process including specifying a specific storage circuit that is a storage circuit including the specific page, reading data stored in a block in a part of the specific storage circuit, and specifying, on the basis of a result of reading the data stored in the block in the part, a failure region in the specific storage circuit.

BRIEF DESCRIPTION OF DRAWINGS

FIG. 6 shows a word line-page correspondence table 760.
FIG. 7 shows a plane-block correspondence table 770.
FIG. 9 shows a page mapping management table 720.
FIG. 10 shows an FMPK state management table 730.
FIG. 11 shows a failure address list 750.

FIG. 19 shows an RG management table 620.

FIG. 20 shows an LU management table 630.

FIG. 21 shows a virtual page mapping management table 650.

FIG. 22 shows a real page state management table 660.

FIG. 23 shows a PDEV management table 640.

DESCRIPTION OF EMBODIMENTS

An overview of the present embodiment will be described. In the present embodiment, when a failure occurs in a specific storage circuit in a non-volatile semiconductor memory in a memory device, a failure region in the memory device is specified without reading all data stored in the storage circuit and only the failure region is closed without closing a whole of the memory device. The present embodiment will be described in detail, below.

First Embodiment

A configuration of a computer system of the present embodiment will be described, below.

Figure 1:
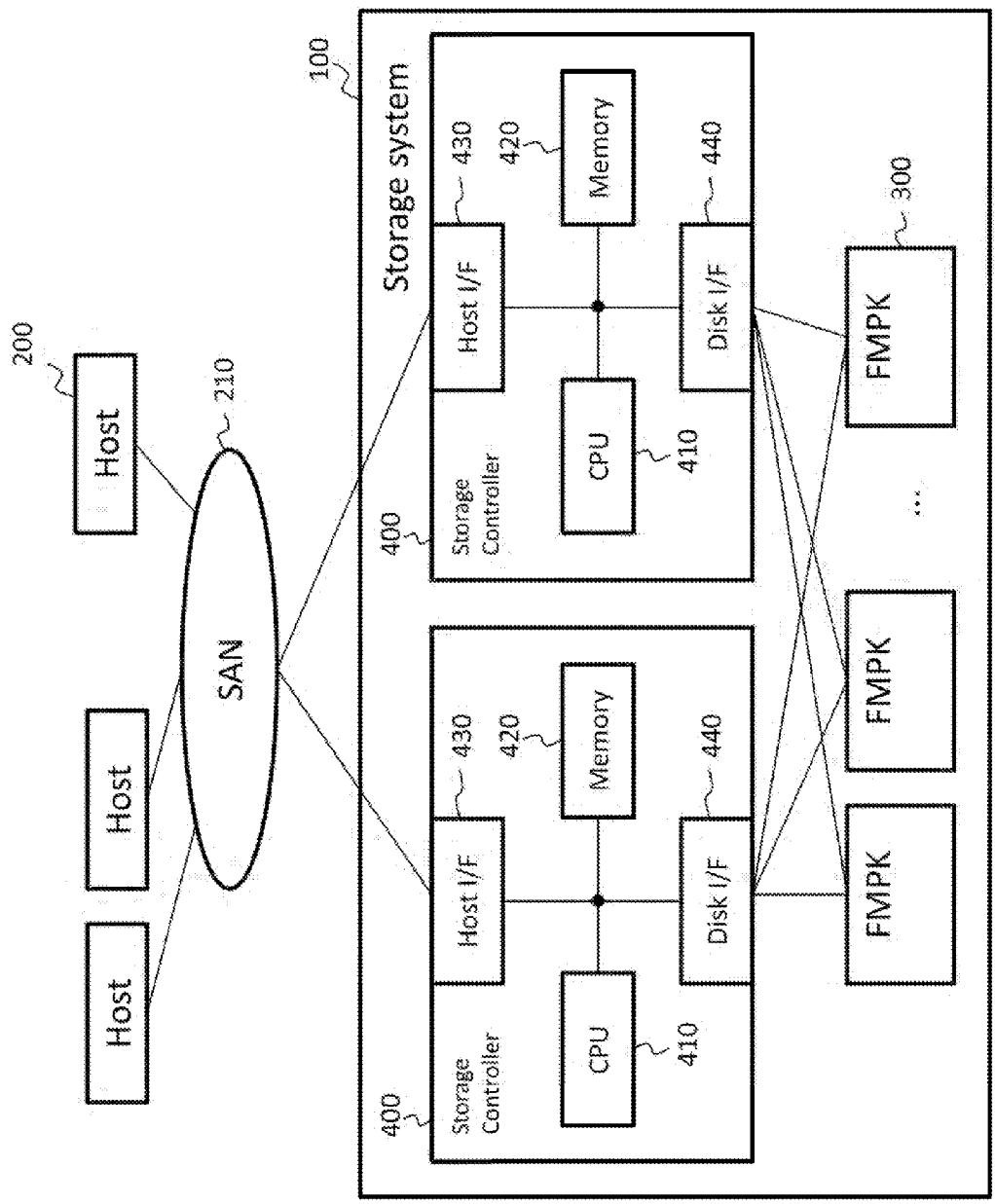
FIG. 1 shows a configuration of a computer system according to an embodiment of the present invention.

FIG. 1 shows the configuration of the computer system according to the embodiment of the present invention.

The computer system has a storage system (storage apparatus) 100, and a plurality of host computers 200. Each of the plurality of host computers 200 is coupled to the storage system 100 via a SAN (Storage Area Network) 210. The computer system may have one or more host computers 200.

The storage system 100 has two storage controllers (DKC: Disk Controllers) 400, and a plurality of FMPKs (Flash Memory Packages) 300. The storage controller 400 is a controller which controls the plurality of memory devices, as a RAID (Redundant Arrays of Inexpensive Disks) group (RG), for example. The two storage controllers 400 are made redundant so that one storage controller 400 controls the storage system 100 during a normal operation and the other storage controller 400 continues the control of the storage system 100 when a failure occurs in the one storage controller 400. In addition to the FMPK 300, another memory device such as SAS (Serial Attached Small Computer System Interface)—HDD (Hard Disk Drive) and SATA (Serial Advanced Technology Attachment)—HDD may be used. In the following description and drawings, such a memory device may be referred to as a "PDEV" (Physical Device).

The storage controller 400 provides the host computers 200 with virtual volumes. The storage controller 400 has a CPU (Central Processing Unit) 410, a memory 420, a host I/F (Interface) 430, and a disk I/F 440. Each part in the storage controller 400 is coupled to one another via a bus. The memory 420 stores a program for controlling the storage system 100. Further, the memory 420 has an area as a cash memory in which data read from the memory device and data written into the memory device are temporarily stored. The CPU 410 controls the storage system 100 in accordance with the program stored in the memory 420. The host I/F 430 is coupled to the SAN 21.0 and exchanges data with the host computer 200. The disk I/F 440 is coupled to the FMPK 300 and exchanges data with the FMPK 300.

Figure 2:
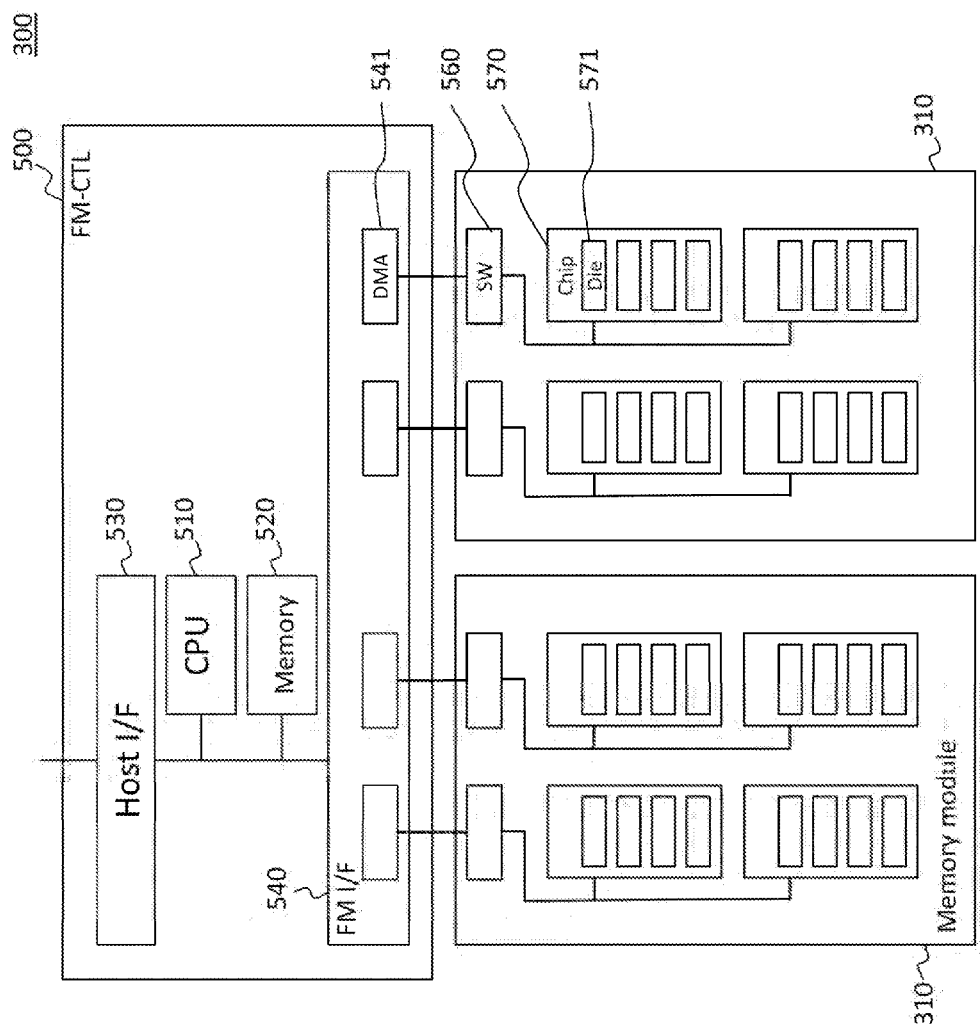
FIG. 2 shows a configuration of an FMPK 300.

FIG. 2 shows a configuration of the FMPK 300.

The FMPK 300 has an FM-CTL (Flash Memory Controller: device controller) 500 and a plurality of memory modules 310. The FM-CTL 500 has a CPU 510, a memory 520, a host I/F 530, and a plurality of FM I/Fs 540. Each part in the FM-CTL 600 is coupled to one another via a bus. The memory 520 stores a program for controlling the FMPK 300. Furthermore, the memory 520 stores data read from an FM chip and data written into the FM chip. The CPU 510 controls the FMPK 300 in accordance with the program stored in the memory 520.

To one FM I/F 540, one memory module 310 is coupled. The FM I/F 540 has a plurality of DMA (Direct Memory Access) controllers 541. The memory module 310 has a plurality of switches (SWs) 560 and a plurality of FM chips 570. To one DMA controller 541, one switch 560 is coupled. To one switch 560, the plurality of FM chips 570 are coupled. The FM chip 570 has a plurality of dies (Dies) 571. The die 571 has a plurality of blocks. The DMA controller 541 controls communication with the FM chip 570. In the following description and drawings, the FM chip 570 may be simply referred to as a "chip" and the DMA controller 541 may be simply referred to as a "DMA".

In the chip, there is a possibility that a failure occurs page by page, block by block, die by die, and plane by plane, for example. A failure occurrence rate may differ depending on each quality of the flash memory. Further, when the DMA has a breakdown, it is not possible access the chip DMA by DMA. In the present embodiment, it is supposed that a capacity of each page, that of each block, that of each die, that of each chip, and the number of chips coupled to each DMA are equal to one another. However, each capacity may be different from one another. When a failure occurs in a page, a block, a plane, a die, a chip, and a DMA, the FM-CTL 500 specifies a failure region, and after that, does not use the failure region.

The FM-CTL 500 provides the storage controller 400 with a logical address space in the FMPK 300. The logical address space is associated with a physical storage area in the FMPK 300. The physical storage area corresponding to a logical storage space provided to the outside of the FMPK 300 is referred to as a "user area". The logical address space is divided into a logical page having a predetermined size in the FMPK 300 to be managed. Upon receipt of a read/write request, in which the logical address is designated, from the storage controller 400, the FM-CTL 500 specifies a physical page from the logical address and executes data read/write. In addition, the FM-CTL 500 manages a failure partially occurring in the FMPK 300.

The physical storage area of the flash memory includes a plurality of blocks, each of which includes a plurality of pages. The block is a unit where data is erased and the page is a unit where data is written and read. That is, the FM-CTL 500 erases data block by block and controls to write and read data page by page.

Further, the flash memory has a characteristic in which no data is overwritten. Thus, upon receipt of data (update data) for updating data stored in a certain page, the FM-CTL 500 writes the updated data into an empty page in which no data is stored. Then, a correspondence relation between the logical page and a page yet to be updated is changed to a correspondence relation between the logical page and a page that is updated. Thus, the storage controller 400 does not need to change the logical address to which the access is made.

Then, the FM-CTL 500 manages data yet to be updated, as invalid data, and data that is updated, as valid data. When the invalid data is erased, a page in which the invalid data is previously stored becomes an empty page into which data can be written. However, the erasure is performed block by block. When valid data and invalid data are mixed in a block, the FM-CTL 500 copies the valid data to another empty page and erases the data present in the block. Process of copying the valid data and erasing the block are referred to as a "reclamation".

Thus, in a flash memory, when there is no empty page, unless the data is erased block by block, it is not possible to newly write data. Further, when erasure process is executed, it is not possible to write data until the erasure process is completed, and thus, a write performance deterioration occurs and another performance deterioration occurs due to an overhead of the erasure process itself. Thus, in the memory device where a flash memory is a storage medium, an area (update area) where the update data is written is provided.

It is noted that it is not necessary that the user area and the update area are physically distinguished from each other. For example, when a certain block is used as the user area and subsequently erased, it is possible to subsequently use the certain block as an update area.

Figure 3:
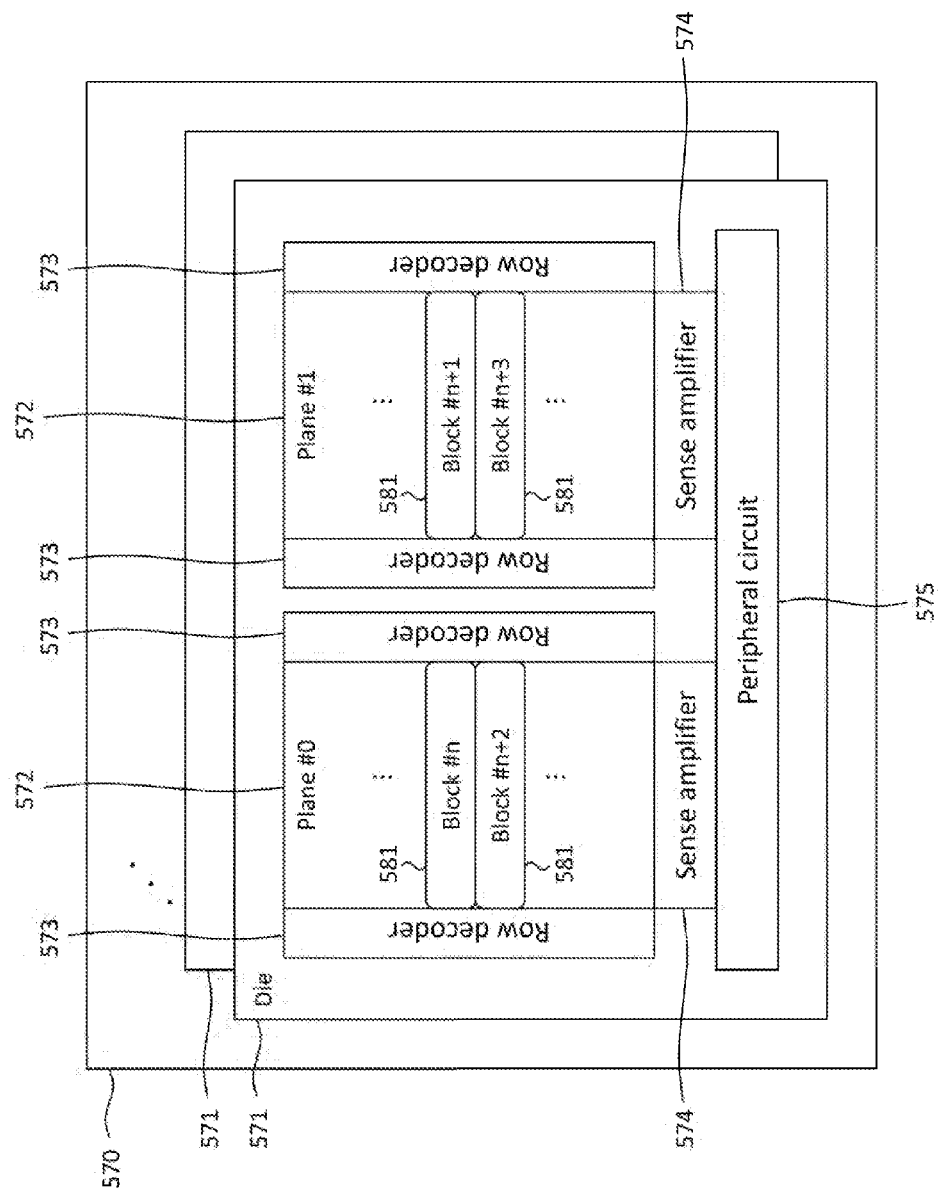
FIG. 3 shows a configuration of an FM chip 570.

FIG. 3 shows a configuration of the FM chip 570.

The FM chip 670 includes a plurality of stacked dies 571. The dies 571 are realized in a semiconductor substrate. The die 571 includes a plurality of planes 572. The plane 572 includes a plurality of blocks 581 arranged in a two-dimensionally arranged column direction. The die 571 further includes a row decoder 573 and a sense amplifier 574 for each plane 572. The row decoder 573 is coupled to the plane 572, selects a word line corresponding to an address designated by the FM-CTL 500, and supplies an electric current through the selected word line. The sense amplifier 674 amplifies voltage obtained from the corresponding plane 572. The die 571 further includes a peripheral circuit 575 coupled to the two sense amplifiers 574. The peripheral circuit 575 is coupled to the row decoders 573 and the sense amplifiers 574 and is further coupled to the switches 560 placed outside the FM chips 670 to boost voltage and control other circuits, for example.

In the present embodiment, the FM chip 570 includes four dies 571. The die 571 includes two planes 572. The plane 572 includes 2048 blocks.

Figure 4:
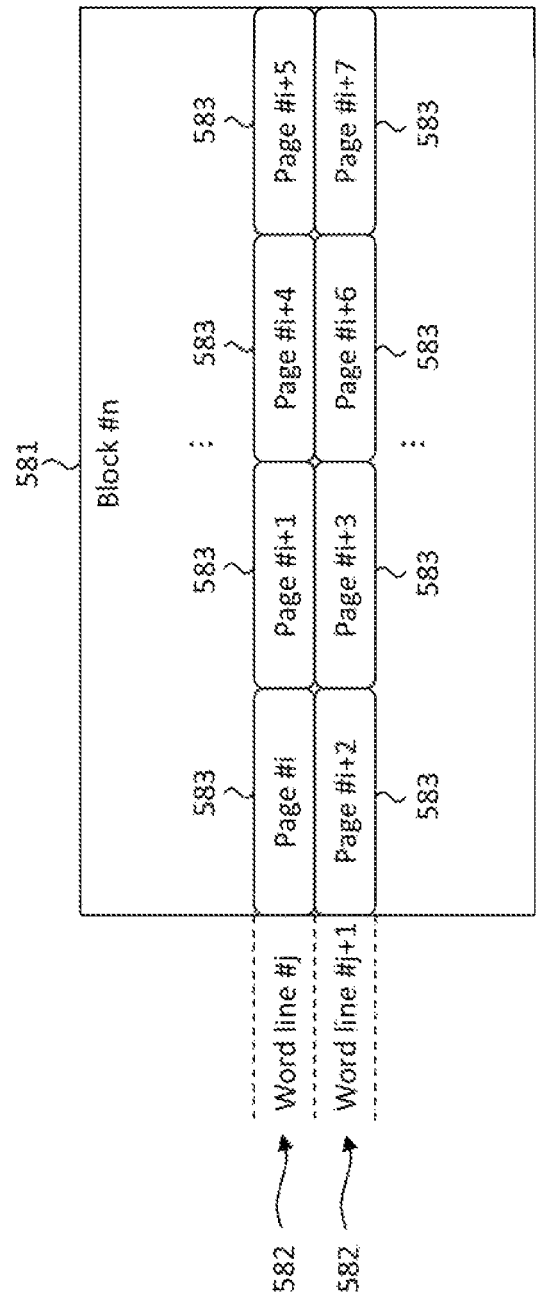
FIG. 4 shows a configuration of a block 581.

FIG. 4 shows a configuration of the block 581.

The block 581, has a plurality of pages 583. Specifically, in the block 581, the plurality of pages 583 are arranged in a column direction and a row direction, and a word line (WL) 582 is coupled to each page row (plurality of pages 583 arranged in the row direction). Out of the plurality of word lines 582, the word line 582 coupled to the page 583 of an access destination is selected to access the page 583 of the access destination. Each page 583 is an aggregate of a plurality of memory cells (cell transistors) coupled in the row direction. The memory cell is a circuit for storing data, and when the memory cell is an SLC (Single-Level Cell), 1-bit data is stored and when the memory cell is an MLC (Multi-Level Cell), multi-bits data is stored, for example.

In the present embodiment, the block 581 has 64 page rows, and, hence, the block 581 is coupled to 64 word lines 582. Four pages 583 are arranged in one page row, and, hence, the block 581 includes the 256 (64×4) pages 583. The page 583 has a size of 8 kB. The page 583 is a unit of a Program (for writing: Write) and Read (for reading). The block 581, is a unit where Erase (erasure) is performed. One page row corresponding to one word line may be represented by the word line 582, below.

In such a configuration, a particle remained on a semiconductor substrate during fabrication, for example, may be a cause of a UE. For example, when short-circuiting occurs between the respectively adjacent two word lines 582 due to the presence of the particle, a UE occurs in reading the data stored in the page 583 corresponding to those word lines 582.

It is noted that the configuration of the storage area in the FM chip 570 is not limited to the example. It is noted that the number of blocks 581 in one die 571 or one plane 572 may be another number, and may be represented by an integer M equal to or larger than 2. The number of pages 583 in one block 581 may be another number, and may be represented by an integer N equal to or larger than 2. The number of word lines 582 in one block 581 may be another number, and may be represented by an integer K equal to or larger than 2. Further, one die 571 may have one plane 572.

The word lines 582 in the block 581 are identified by a consecutive word line number. The pages 583 in the block 581 are identified by a consecutive page number.

Figure 5:
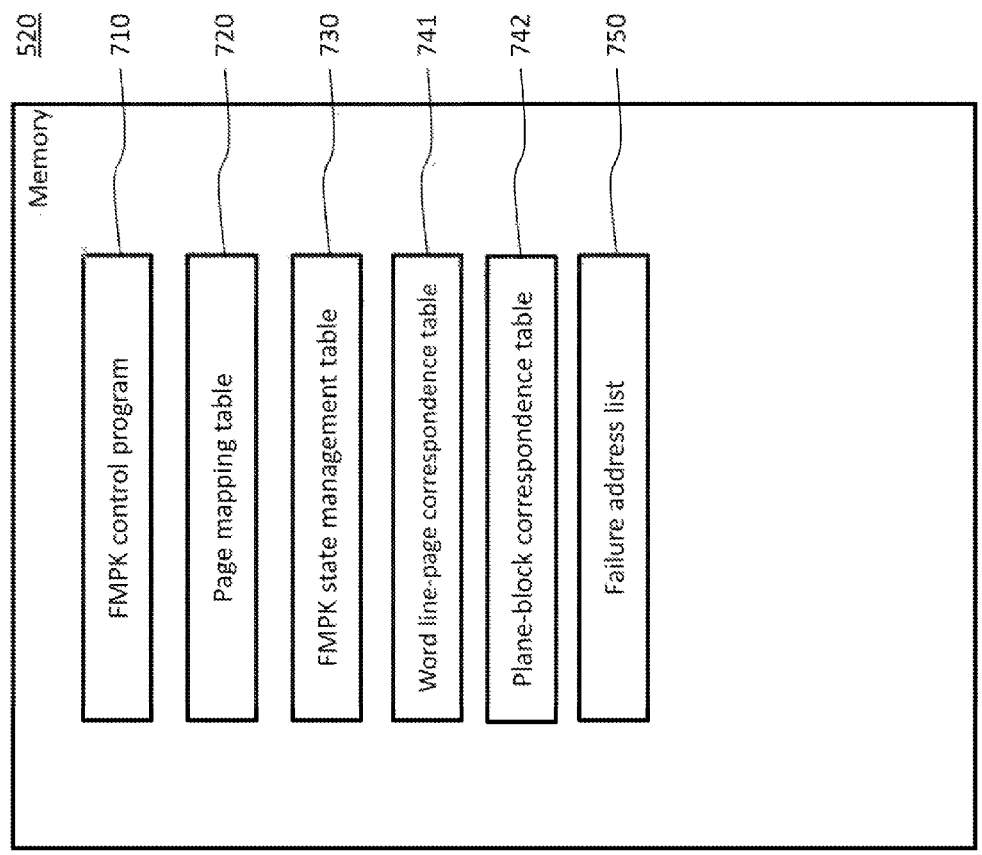
FIG. 5 shows information stored in a memory 520 of an FM-CTL 500.

FIG. 5 shows information stored in the memory 520 of the FM-CTL 500.

The memory 520 stores an FMPK control program 710, a page mapping management table 720, an FMPK state management table 730, a failure address list 750, a word line-page correspondence table 760, and a plane-block correspondence table 770. The CPU 510 executes control of the FMPK 300 in accordance with the FMPK control program 710.

FIG. 6 shows the word line-page correspondence table 760.

The word line-page correspondence table 760 shows a case where the number of the word lines (#of WLs), included in one block is 64. The word line-page correspondence table 760 includes an entry for each word line. The entry of a certain word line includes a word line number (WL #) and a page number (Page #). The word line number is the number indicating the word line in the block including the word line. The page number indicates a plurality of pages included in the word line, and is the number indicating the page in the block. One word line number is correlated with four page numbers.

FIG. 7 shows the plane-block correspondence table 770.

The plane-block correspondence table 770 shows a case where the number of planes 572 (#of Planes), included in one die 571 is two. The plane-block correspondence table 770 includes an entry for each plane. The entry of a certain plane includes a plane number (Plane #) and a block number (Block #). The plane number is the number indicating the plane in the die including the plane. The block number shows a plurality of blocks included in the plane, and is the number indicating the block in the die. Out of the two planes #0 and #1, the plane #0 includes a block whose block number is an even number, and the plane #1 includes a block whose block number is an odd number. As a result, the FM-CTL 500 is capable of determining to which of either plane a certain block belongs.

The same figure also shows a plane-block correspondence table 770b where one die 571 includes four planes 572 and one plane 572 includes 4096 blocks. The plane number of the plane 571 to which a certain block 581 belongs is a remainder obtained when the block number is divided by 4, which is the number of planes.

Figure 8:
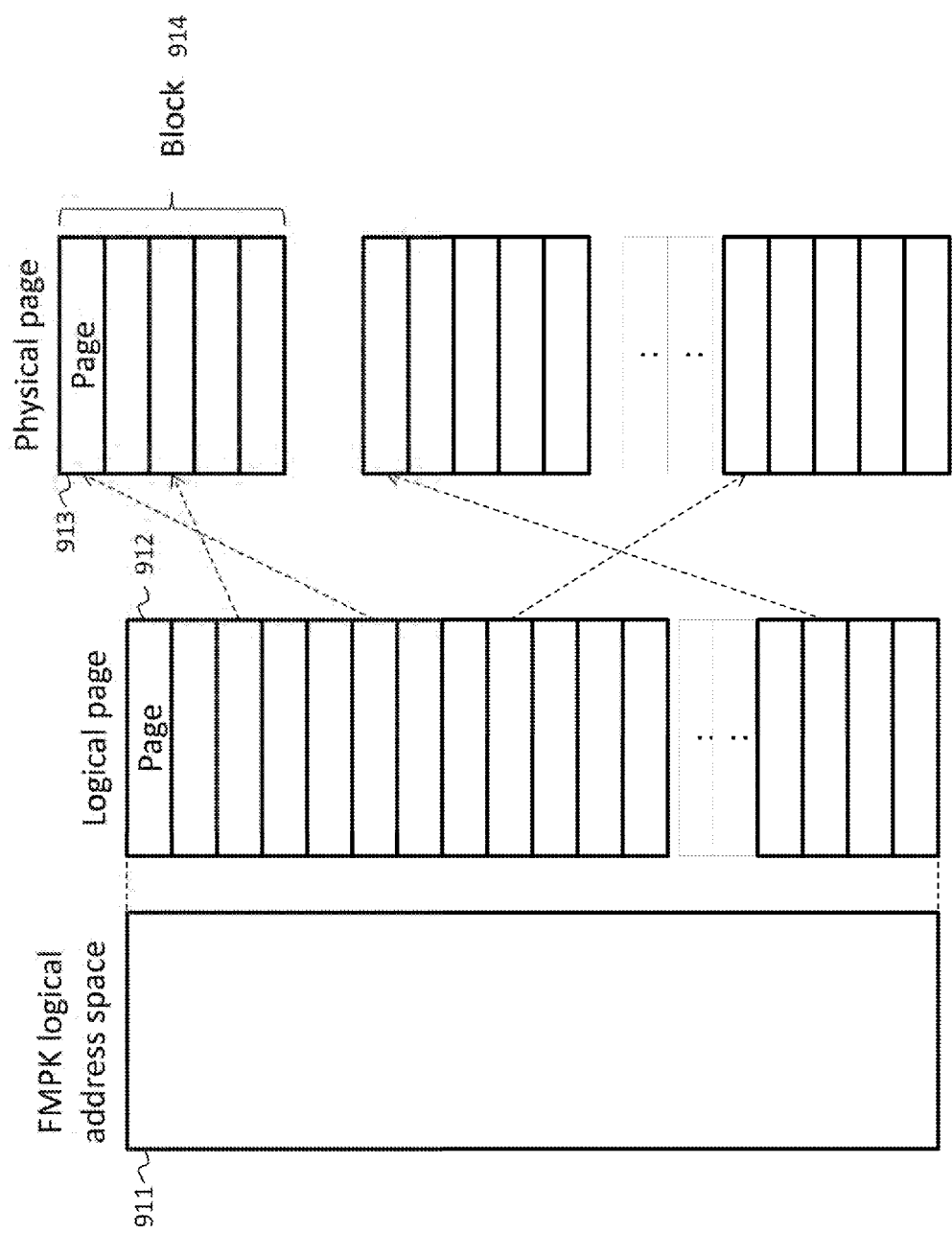
FIG. 8 shows configurations of a logical page and a physical page of an FMPK 300.

FIG. 8 shows configurations of the logical page and the physical page of the FMPK 300.

The FM-CTL 500 provides the storage controller 400 with a logical address space 911 and manages the logical address space 911 by dividing the logical address space 911 into logical pages 912 each of which has a predetermined page size (for example, 8 kB). The FM-CTL 500 manages the block by dividing the block into physical pages 913 each of which has a predetermined page size (for example, 8 kB). Here, in order to distinguish the page in the FM chip 570 from the logical page 912, this page is referred to as the "physical page 913". The FM-CTL 500 allocates the physical page 913 to the logical page 912. The block 914 has a predetermined number (for example, 256) of physical pages 913. The FM-CTL 600 reads and writes data between the FM chip 570 the physical page 913 by the physical page 913 and erases the data from the FM chip 570 the block 914 by the block 914. The logical address may be referred to as an "LBA" (Logical Block Address), and the physical page may be simply referred to as a "page", below.

FIG. 9 shows the page mapping management table 720.

The page mapping management table 720 has an entry for each logical page. The entry of a certain logical page has: an LBA 723 indicating the top of the logical page; a logical page identifier 721 indicating the logical page; and a physical page identifier 722 indicating the physical page allocated to the logical page. When no physical page is allocated to the logical page, the physical page identifier 722 shows "Unallocated". The physical page identifier shows a combination of: a chip number indicating a location of a chip in the FMPK 300; a die number indicating a location of a die in the chip; a block number indicating a location of a block in the die; a word line number indicating a location of a word line in the block; and a page number indicating a location of the physical page in the block, for example. It is noted that the memory 520 may store correlation information indicating a correlation between a unique physical page identifier in the FMPK 300; and the chip number, the die number, the block number, the word line number, and the page number, and the FM-CTL 600 may specify, on the basis of the correlation information, the chip number, the die number, the block number, the word line number, and the page number, from the physical page identifier.

FIG. 10 shows the FMPK state management table 730.

The FMPK state management table 730 has a DMA management table 810 for each DMA.

The DMA management table 810 of a certain DMA has: a DMA number (DMA #) 811 indicating the DMA; a Status 812 of the DMA; a number of defective chips 813 in all the chips belonging to the DMA; a total number of chips 814 belonging to the DMA; and a chip management table 820 for each chip belonging to the DMA. When the DMA is available, the Status 812 shows "Good" and otherwise, the Status 812 shows "Bad".

The chip management table 820 of a certain chip has: a chip number (Chip #) 821 indicating the chip; a Status 822 of the chip; a number of defective dies 823 in all the dies in the chip; a total number of dies 824 in the chip; and a die management table 830 for each die in the chip. When the chip is available, the Status 822 shows "Good" and otherwise, the Status 822 shows "Bad".

The die management table 830 of a certain die has: a die number (Die #) 831 indicating the die; a Status 832 of the die; a number of defective blocks 833 in all the blocks in the die; a number of allocated blocks 834 that is the number of the blocks already allocated to the logical page in the die; a total number of blocks 836 in the die: and a block management table 840 for each block in the die. When the die is available, the Status 832 shows "Good" and otherwise, the Status 832 shows "Bad". When the die is a die to be diagnosed (described later), the Status shows "Under Diagnosis".

The block management table 840 of a certain block has: a block number (Block #) 841 indicating the block; a Status 842 of the block; a total number of pages 843 in the block; an In-use 844 that is the number of pages (in use) in which data is stored in all the pages in the block; a Valid 845 that is the number of valid pages in the pages in use; and an Invalid 846 that is the number of invalid pages in the pages in use. When the block is available and stores data therein, the Status 842 shows "Allocated" and when the block is available and stores no data therein, the Status 842 shows "Unallocated". In addition, the Status 842 shows "Breakdown" when a failure occurs in the block, and shows "Expired" when the number of times that the block is rewritten exceeds a threshold value.

In the present embodiment, description proceeds mainly with an example where a failure occurs die by die, plane by plane, and block by block; however, it may be possible to manage the occurrence of failure in terms of another physical unit such as DMA and a chip.

FIG. 11 shows the failure address list 750.

The FM-CTL 500 detects, in the FMPK 300, a failure region that is a physical storage area where a failure occurs, creates the failure address list 750 showing a logical address area (logical address range) corresponding to the failure region, and transmits the same to the storage controller 400. In the FMPK 300, the failure address list 750 has an entry for each failure area that is the logical address area in an FMPK logical address space corresponding to the physical storage area where the failure occurs. A certain entry has a failure address 751 that is a start LBA of the failure area, and a length 752 that is a length of the failure area.

When a failure occurs in the physical storage area, data stored in such a physical storage area is lost. The FM-CTL 500 is not capable of restoring the lost data. Therefore, when the FM-CTL 500 specifies the logical address area corresponding to the physical storage area where the failure occurs and notifies the storage controller 400 of the logical address area, the storage controller 400 becomes capable of restoring the lost data from a different FMPK 300 by using RAID. The storage controller 400 is not capable of recognizing the failure in the physical storage area, and thus, when not being capable of acquiring the logical address area from the FM-CTL 500, it is necessary to restore all the data in the FMPK 300. The larger the capacity of the FMPK 300, the more likely that a time is required for restoring the data, resulting in a degraded redundancy state during that time. As the present embodiment, however, when the FM-CTL 500 notifies the storage controller 400 of the specified logical address area, it is possible to restore the data in an appropriate range. As a result, it is possible to complete the restoring operation of data in a short time, and it is possible to improve the reliability of the storage system by shortening a time during which the redundancy is degraded.

An operation of the storage system 100 will be described below.

Here, description proceeds with failure notification process that is processing where when an uncorrectable error is detected by the FM-CTL 500 of a certain FMPK 300, the FM-CTL 500 notifies the storage controller 400 of a failure area. The uncorrectable error may be referred to as a "UE", below. The FM I/F 540 includes: an ECC generating circuit which generates an ECC (Error Correction Code) on the basis of data; a data loss detection circuit which detects a data loss by the ECC; and an ECC correction circuit which corrects data by the ECC. When writing data into the memory module 310, the FM I/F 540 writes the data with the ECC, and corrects the error occurring when the data is read, on the basis of the ECC. For, example, one page 583 stores a predetermined number of ECC CWs (Code Words). One ECC CW includes data and the ECC based thereon. An error correction capability in this case is represented in a number of correctable failure bits that is a number of failure bits that can be corrected in one ECC CW. An error correction capability of an ECC differs depending on each type of the ECC. When the number of failure bits in the read ECC CW is equal to or less than the number of correctable failure bits, the FM I/F 540 corrects a failure bit in the ECC CW (correctable error). When the number of failure bits in the read ECC CW exceeds the number of correctable failure bits, that is, when the read error exceeds the error correction capability, the FM I/F 540 determines that the UE occurs.

Figure 12:
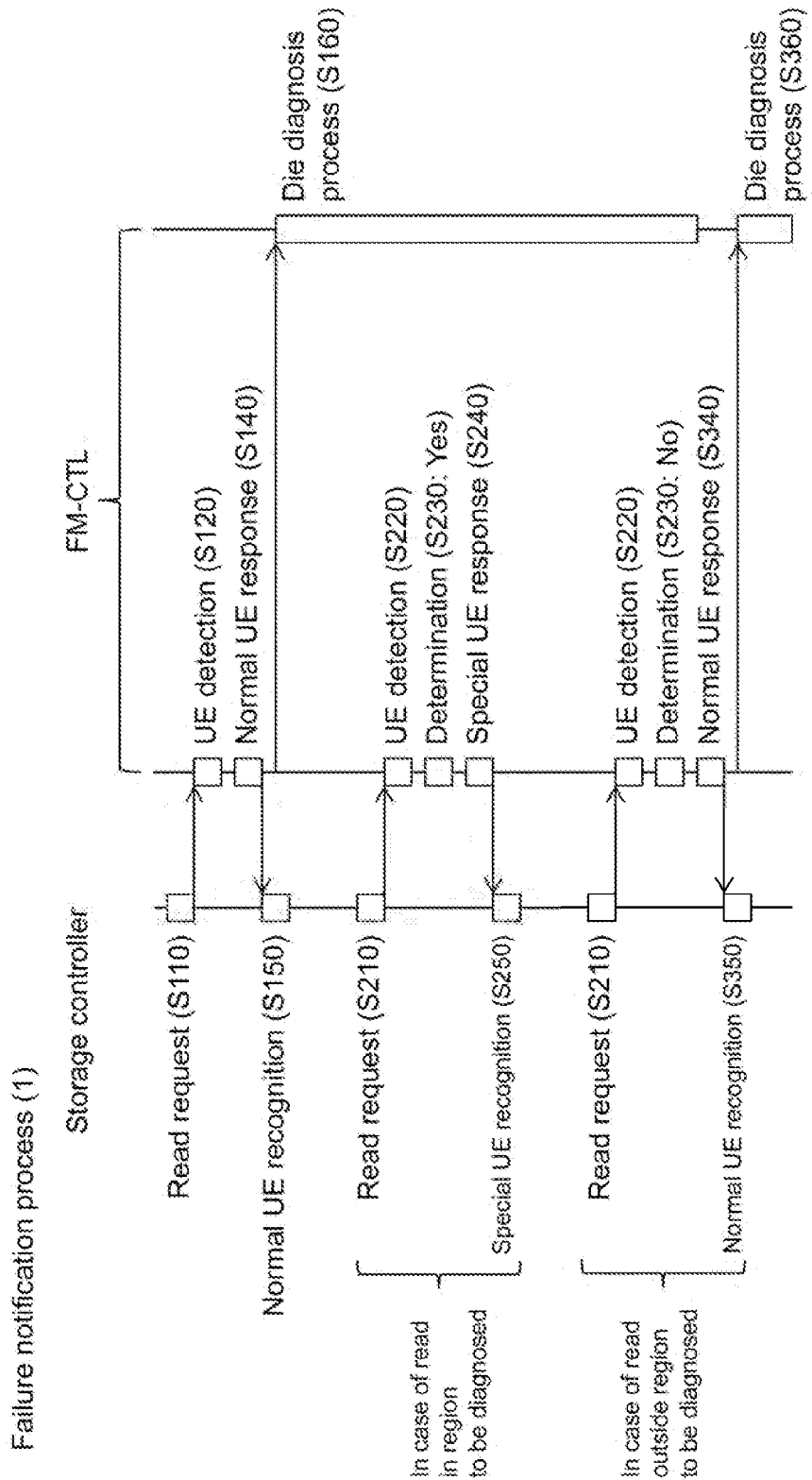
FIG. 12 shows a first operation of failure notification process.
Figure 13:
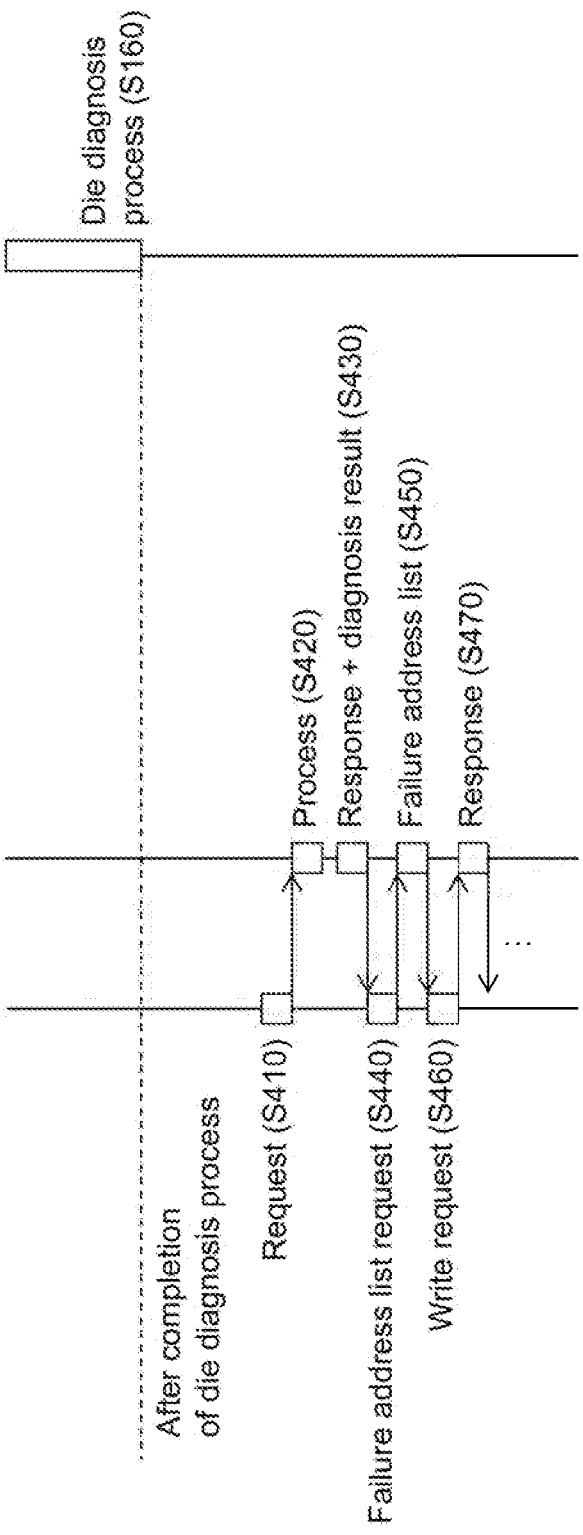
FIG. 13 shows a second operation subsequent to a first operation of failure notification process.

FIG. 12 shows a first operation of the failure notification process. FIG. 13 shows a second operation subsequent to the first operation of the failure notification process.

At S110, the storage controller 400 transmits a read request to the FMPK 300 in response to a command or the like from the host 200. Subsequently, at S120, the FM-CTL 500 reads data from the physical page corresponding to the designated LBA designated by the page mapping management table 720 and the read request. Here, it is supposed that the FM-CTL 500 detects a UE as a result of reading. Subsequently, at S140, the FM-CTL 500 transmits a normal UE response indicating the UE, to the storage controller 400. Subsequently, at S150, the storage controller 400 receives the normal UE response and recognizes the UE. Here, the storage controller 400 counts the number of the normal UE responses received from the FMPK 300 within a predetermined time. When the number of the normal UE responses exceeds a predetermined threshold value of the number of UEs, the storage controller 400 separates the FMPK 300 and reconstructs an RG by using a spare FMPK 300 previously prepared, instead of the FMPK 300.

Subsequently, at S160, the FM-CTL 500 specifies a physical page where the UE occurs, as a UE page, selects the die 571 including the UE page, as a region to be diagnosed, and starts die diagnosis process for diagnosing the region to be diagnosed. Here, the FM-CTL 500 changes the Status 832 of the die in the region to be diagnosed to "Under Diagnosis", in the FMPK state management table 730.

It is noted that the FM-CTL 500 starts the die diagnosis process even when a UE is detected during internal process such as reclamation. In order to diagnose the FMPK 300, the storage controller 400 may regularly select a page according to a predetermined rule, and transmit the read request, while designating such a page, to the FMPK 300.

It is supposed that at S210 during the die diagnosis process, the storage controller 400 transmits the read request. At S220, the FM-CTL 500 receives the read request and reads data from the physical page corresponding to the designated LBA designated by the read request. When the FM-CTL 500 normally completes the reading, a normal response is transmitted to the storage controller 400. Here, it is supposed that the FM-CTL 500 detects a UE as a result of reading. Subsequently, at S230, the FM-CTL 500 determines whether the physical page is included in the region to be diagnosed. Here, when the Status 832 of the die including the physical page shows "Under Diagnosis" in the FMPK state management table 730, the FM-CTL 500 determines that the physical page is included in the region to be diagnosed. For example, when the storage controller 400 transmits a read request by a re-try in response to the above-described recognition of the UE, this means that the physical page is included in the region to be diagnosed.

When it is determined as a result of S230 that the physical page is included in the region to be diagnosed (Yes), at S240, the FM-CTL 500 transmits a special UE response for requesting the storage controller 400 to not count the UE, to the storage controller 400. Subsequently, at S250, the storage controller receives the special UE response to recognize the UE; however, the UE is not counted.

When it is determined as a result of S230 that no physical page is included in the region to be diagnosed (No), at S340, the FM-CTL 500 transmits a normal UE response indicating the UE, to the storage controller 400. Subsequently, at S350, the storage controller 400 receives the normal U E response to recognize the UE, and counts the UE of the FMPK 300. Subsequently, at S360, the FM-CTL 500 determines a new UE page and a new region to be diagnosed, and starts die diagnosis process on the new region to be diagnosed. In the die diagnosis process, the FM-CTL 500 detects a failure region and generates the failure address list 750 indicating the LBA corresponding to the failure region.

It is supposed that upon completion of the die diagnosis process started at S160, the storage controller 400 transmits, at 8410, a read or write request, to the FMIPK 300. Subsequently, at S420, the FM-CTL 500 receives the I/O request and performs a process responding to the I/O request. Subsequently, at S430, the FM-CTL 500 transmits a response indicating a result of the process and a result of the die diagnosis process, to the storage controller 400. It is noted that the FM-CTL 500 may transmit, besides the I/O request, a result of the die diagnosis process to the storage controller 400, in response to another command, such as a diagnosis command, from the storage controller 400.

Subsequently, at 5440, the storage controller 400 receives such a response to recognize the presence of the diagnosis result, and transmits, to the FM-CTL 500, a failure address list request for requesting the failure address list 750.

Thereafter, upon receipt of the failure address list request, at S450, the FM-CTL 500 transmits the failure address list 750 indicating the LBA of the failure area corresponding to the failure region detected in the die diagnosis process, to the storage controller 400. Thereafter, the FM-CTL 500 deletes the transmitted failure address list 750.

Subsequently, at S460, the storage controller 400 receives the failure address list 750 to recognize a failure area (range of the LBA) where the lost data is stored, on the basis of the failure address list 750, restores the lost data by correction using the RG including the FMPK 300, and transmits a write request for writing back the restored data in the failure area and the restored data to the FM-CTL 500. Subsequently, at S470, the FM-CTL 500 receives the write request and the restored data, writes the restored data into the designated LBA, and transmits a response to the write request to the storage controller 400. Here, the FM-CTL 500 allocates a normal physical page to the designated LBA and writes the restored data into the physical page.

The storage controller 400 repeats steps at S460 and S470 until the completion of restoring and writing-back of all the data shown in the failure address list 750.

According to the foregoing failure notification process, the FMPK 300 is capable of diagnosing the die where a UE occurs in accordance with the detection of the UE. Further, upon receipt of the failure address list 750 from the FM-CTL 500, the storage controller 400 is capable of recovering the data lost by the UE by using an RG and capable of writing the recovered data back in the FMPK 300.

Even when the storage controller 400 issues, to the FMPK 300, the read request for the region to be diagnosed by a re-try or the like, when the FMPK returns the special UE response to the storage controller 400, then it is possible to prevent the storage controller 400 from counting the number of the UEs of the FMPK. As a result, it is possible to prevent the storage controller 400 from separating the FMPK because of the UE currently receiving the die diagnosis process, it is possible to continue with the use of the FMPK. Even while the FMPK is performing the die diagnosis process, the storage controller 400 is capable of accessing a region other than the region to be diagnosed in the FMPK.

In a case where a protocol such as SCSI in which the FMPK 300 responds in response to the request from the storage controller 400 is used, when the FMPK 300 adds the result of the die diagnosis process to another request, the FMPK 300 is capable of notifying the storage controller 400 of the result of the die diagnosis process. It is noted that when the storage controller 400 and the FMPK 300 use a protocol such as FICON (Fiber Connection) allowing the notification to be sent to the storage controller 400 from the FMPK 300, the FMPK 300 may notify the storage controller 400 of the result of die diagnosis process without waiting for the request from the storage controller 400.

Figure 14:
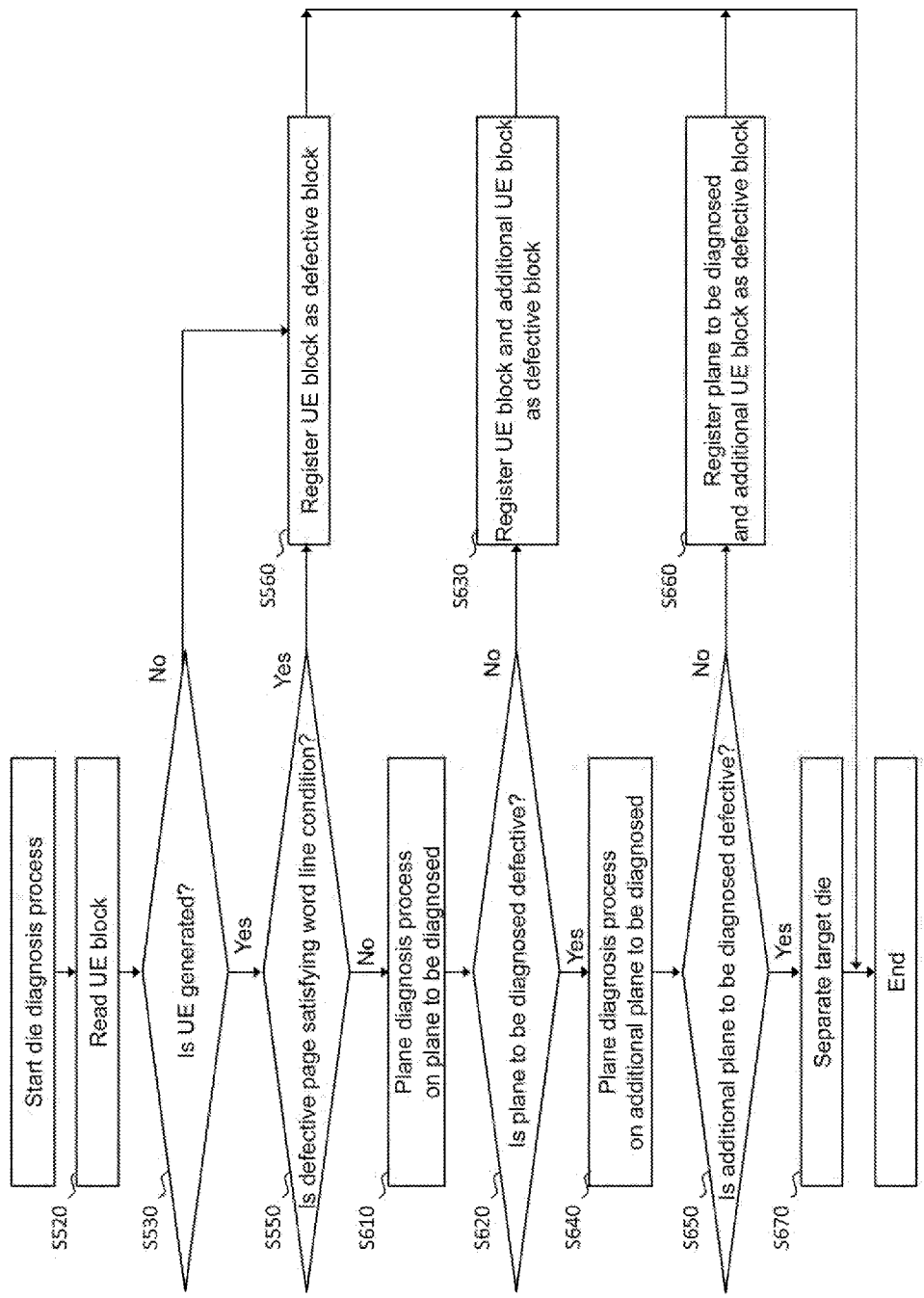
FIG. 14 shows die diagnosis process.

FIG. 14 shows the die diagnosis process.

Using the above-described S160 and S360, the FM-CTL 500 starts the die diagnosis process.

At S520, the FM-CTL 500 specifies a block including a UE page, as a UE block, and reads data stored in all the pages in the UE block. Subsequently, at S530, the FM-CTL 500 determines whether the UE occurs as a result of the reading.

When it is determined as a result of S530 that no UE occurs (No), at S560, the FM-CTL 500 registers the UE block as a defective block, and then, the flow is ended. Here, in the FMPK state management table 730, the FM-CTL 500 changes the Status 842 in the block management table 840 corresponding to the UE block, to "Breakdown", and adds 1 to the number of defective blocks 833 in the die management table 830 corresponding to the die including the block.

When it is determined as a result of S530 that a UE occurs (Yes), at S550, the FM-CTL 500 specifies the page where the UE occurs in the UE block, as a defective page, and determines whether the defective page satisfies a word line condition. Here, the word line condition requires the defective page to be distributed only over a range of respectively adjacent two word lines. In this case, the FM-CTL 500 estimates that a cause of the UE is the presence of the above-described particle, and is capable of specifying the failure region. It is noted that the word line condition may require that the defective page is distributed only over a range of consecutive three word lines.

When it is determined as a result of S550 that the defective page satisfies the word line condition (Yes), the FM-CTL 500 registers, at S560, the UE block as the defective block in the FMPK state management table 730, specifies the failure area corresponding to the defective block on the basis of the page mapping management table 720, and registers the failure area in the failure address list 750, and then, the flow is ended.

When it is determined as a result of S550 that the defective page does not satisfy the word lien condition (No), the FM-CTL 500 specifies, at S610, the plane including the UE block, as a plane to be diagnosed, and performs plane diagnosis process for diagnosing the plane to be diagnosed. Subsequently, at S620, the FM-CTL 500 determines whether the plane to be diagnosed is evaluated as defective by the plane diagnosis process.

When it is not determined as a result of S620 that the plane to be diagnosed is defective (No), the FM-CTL 500 registers, at S630, the UE block and an additional UE block detected in the plane diagnosis process, as defective blocks, in the FMPK state management table 730, specifies the failure area corresponding to the defective block, and registers the failure area in the failure address list 750, and then, the flow is ended.

When it is determined as a result of S620 that the plane to be diagnosed is defective (Yes), the FM-CTL 500 specifies, at S640, the die including the plane to be diagnosed, as a target die, specifies a different plane in the target die as an additional plane to be diagnosed, and performs the plane diagnosis process for diagnosing the additional plane to be diagnosed. Subsequently, at S650, the FM-CTL 500 determines whether the additional plane to be diagnosed is evaluated as defective by the plane diagnosis process.

When it is not determined as a result of S650 that the additional plane to be diagnosed is defective (No), the FM-CTL 600 registers, at S660, all the blocks in the plane to be diagnosed and the additional UE block detected in the plane diagnosis process, as defective blocks, in the FMPK state management table 730, specifies a failure area corresponding to the defective blocks, and registers the failure area in the failure address list 750, and then, the flow is ended.

When it is determined as a result of S650 that the additional plane to be diagnosed is defective (Yes), at 8670, the FM-CTL 500 separates (closes) the target die, and then, the flow is ended.

It is noted that when the target die includes three planes or more, at S640, the FM-CTL 500 may select a plane which shares a circuit coupled to the plane to be diagnosed, as the additional plane to be diagnosed. Further, out of three or more planes in the target die, when it is determined that the two planes are defective, the FM-CTL 500 may determine that the target die is defective.

According to the above-described die diagnosis process, the FM-CTL 500 is capable of estimating the failure caused by the particle within a short time on the basis of a structure of the memory cell in the target die and specifying a smallest possible block as a failure region. Only when, as a result of reading the data stored in the UE block, the location of the UE occurring is distributed in a range wider than the respectively adjacent two word lines, the FM-CTL 500 performs the plane diagnosis process to thereby reduce a load for the die diagnosis process. Further, when, as a result of reading the data stored in the UE block, no UE occurs or a location of the occurring UE is distributed only in the range within the respectively adjacent two word lines, the FM-CTL 500 is capable of specifying the UE block as the failure region. Further, only when it is determined that the plane is defective, the FM-CTL 500 determines whether another plane in the die including the plane is defective and it is thus possible to diagnose the die in a short time.

Figure 15:
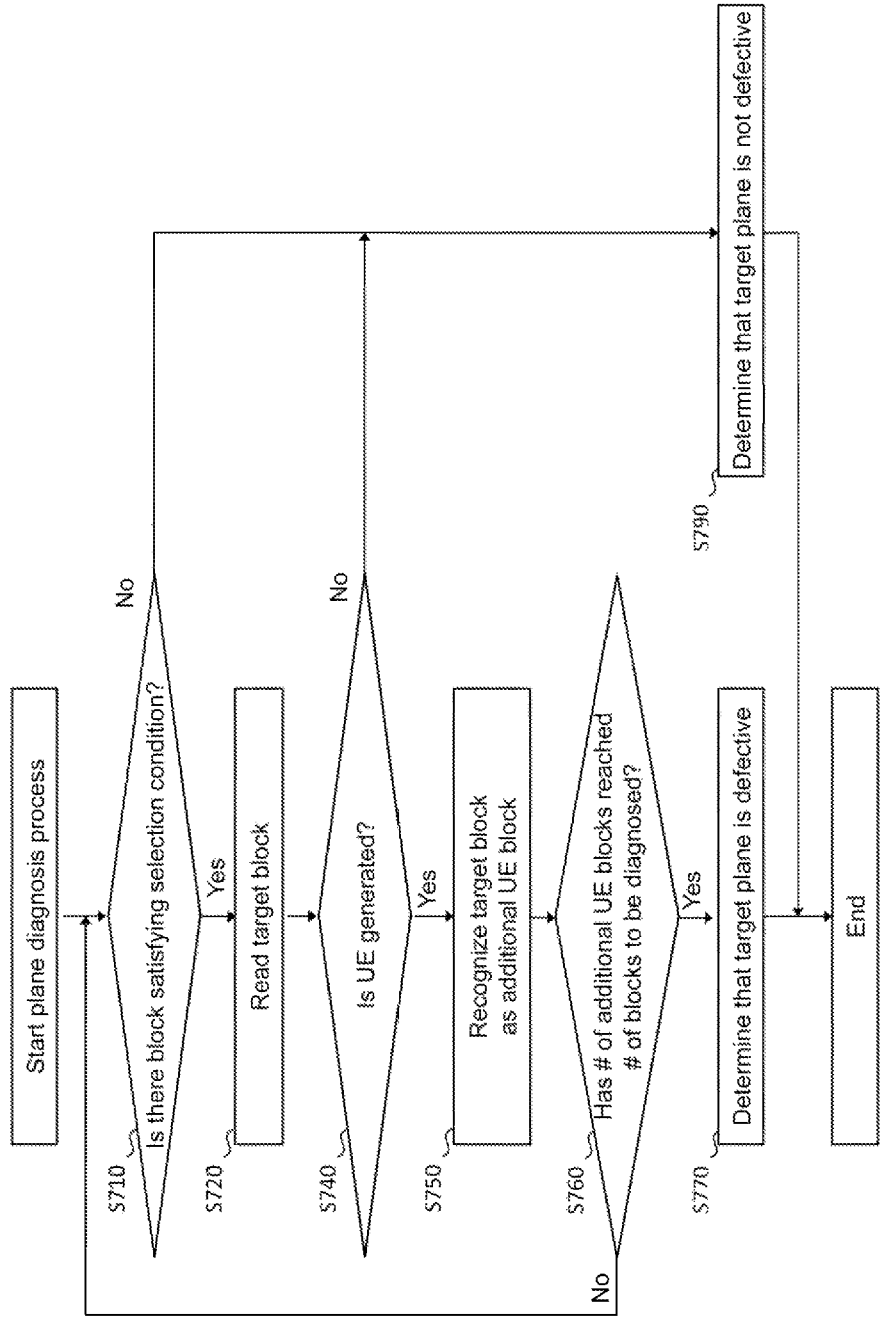
FIG. 15 shows plane diagnosis process.

FIG. 15 shows the plane diagnosis process.

At the above-described S610 and S640, the FM-CTL 500 performs the plane diagnosis process. Here, the plane to be diagnosed or the additional plane to be diagnosed designated as the target for the plane diagnosis process are referred to as a "target plane".

At S710, the FM-CTL 500 determines whether there is a block satisfying a selection condition in the block that is not yet selected as the target block in the target plane. Here, the block satisfying the selection condition is a block in which data is written up to the last page. When, for example, data is written into a certain block, the FM-CTL 500 writes data into an ascending order of the page number from the top page. In the block management table 840 corresponding to the block, in the FMPK state management table 730, when the In-use 843 is equal to the total number of pages 843, the FM-CTL 500 determines that data is written up to the last page of the block. Further, the block satisfying the selection condition is not an open block. The term "open block" means a physical block in which data is written up to a particular middle physical page (physical block where data is written at least in the top page; however, there is still an empty page). It is supposed that, for example, one physical block is configured by N (where N is an integer equal to or larger than 2) physical pages and data is written up to an X-th page (wherein X is an integer equal to or less than 2 and less than N). In this case, when a predetermined number Y is used, there is a tendency that a characteristic of a (X-Y)-th page to the X-th page (several Y-pages preceding from the page in which data is written last) deteriorates (error occurrence rate increases) ("Y" is an integer equal to or larger than 1). If all pages are already written, no such deterioration of characteristic occurs. The deterioration of characteristic caused by the open block does not depend on characteristics of a whole of a die. When the block that is not an open block is selected as the target block, it is possible to remove an influence of an error caused by the open block during the plane diagnosis process. Further, the block in which data is not written into any single page is a block where read is not possible, and thus, does not satisfy the selection condition.

When it is determined as a result of S710 that there is no block satisfying the selection condition (No), the FM-CTL 500 determines at S790 that the target plane is not defective, and then, the flow is ended.

When it is determined as a result of S710 that there is the block satisfying the selection condition (Yes), the FM-CTL 500 selects, at S730, the block satisfying the selection condition, as the target block, and reads the data stored in all pages in the target block. Here, when it is determined that a plurality of blocks satisfy the selection condition, the FM-CTL 500 randomly selects, as the target block, one block from among the plurality of blocks. Subsequently, at S740, the FM-CTL 500 determines whether a UE occurs by the reading.

When it is determined as a result of S740 that no UE occurs (No), at S790, the FM-CTL 500 determines that the target plane is not defective, and then, the flow is ended.

When it is determined as a result of S740 that a UE occurs (Yes), at S750, the FM-CTL 500 recognizes the target block as an additional UE block. Subsequently, at S760, the FM-CTL 500 determines whether the number of additional UE blocks reaches a predetermined number of blocks to be diagnosed. The number of blocks to be diagnosed is 5, for example. It is noted that the number of blocks to be diagnosed may be another number and may be represented by an integer L equal to or larger than 2 and less than M. The greater the number of additional UE blocks in the target plane, the more likely that the target plane is defective. The number of additional UE blocks by which the probability sufficiently increases is previously determined as a number of blocks to be diagnosed.

When it is determined as a result of S760 that the number of additional UE blocks does not reach the number of blocks to be diagnosed (No), the FM-CTL 500 shifts the process to S710.

When it is determined as a result of S760 that the number of additional UE blocks reaches the number of blocks to be diagnosed (Yes), at S770, the FM-CTL 500 determines that the target plane is defective, and then, the flow is ended.

Examples of a case where the target plane is defective include a case where it is not possible to control the target plane due to a breakdown in the row decoder 573 and the sense amplifier 574 coupled to the target plane. Examples of a case where the target die is defective include a case where it is not possible to control the target die due to a breakdown in the peripheral circuit 575 coupled to the two planes 572 in the target die.

According to the above-described plane diagnosis process, the FM-CTL 500 selects the block satisfying the selection condition in the target plane and reads data stored in the block, and when the number of blocks where a UE occurs reaches the number of blocks to be diagnosed, it is determined that the target plane is defective, whereby it is possible to detect the defect of the plane 572 without reading the data stored in all the pages in the plane 572. As a result, as compared to a case where the data stored in all the pages in the plane 572 is read, it is possible to suppress a diagnosis time and a load of the FM-CTL 500 and prevent degraded performance of the FMPK 300. Further, the block is selected from the target plane, and when a UE is detected in the number of blocks to be diagnosed of the blocks, it is determined that the target plane is defective, whereby it is possible to maintain the accuracy of diagnosing the target plane.

When the defective block is specified in the die diagnosis process, the FM-CTL 500 changes the Status 842 in the block management table 840 of the block in the FMPK state management table 730 to "Bad", and increases the number of defective blocks 833 of the die management table 830 of the die including the block. When the defective die is specified in the die diagnosis process, the FM-CTI. 500 changes the Status 832 in the die management table 830 of the die in the FMPK state management table 730 to "Bad", and increases the number of defective dies 823 of the chip management table 820 of the FM chip including the die.

After the die diagnosis process, the FM-CTL 500 does not allocate the physical page in the block registered as the defective block, to the logical page. As a result, an update area of the FMPK 300 decreases with an increase in the defective blocks; however, the FMPK 300 is capable of continuously performing the operation without closing the whole of the FMPK 300.

If the FM-CTL 500 reads and diagnoses a whole of the data stored in the plane or the die where a UE occurs, then it may be that during the diagnosis, the failure region is used in response to the I/O request from the storage controller 400 and I/O performance in other regions deteriorates due to a load of diagnosis. According to the present embodiment, when a UE is detected in a certain die, the FM-CTL 500 is capable of specifying the failure region in the die without reading the data stored in all the pages in the die. When a UE is detected, the FM-CTL 500 is capable of specifying the failure region block by block, plane by plane, and die by die, and separating the failure region only. Furthermore, even though the FM-CTL 500 does not have a function of directly detecting the breakdown in a circuit such as the row decoder 573, the sense amplifier 574, and the peripheral circuit 575 in the die 571, when the die diagnosis process is performed, the FM-CTL 500 is capable of specifying the failure region caused by breakdowns in these circuits.

It is noted that the FM-CTL 500 may perform the die diagnosis process in accordance with an error such as a status error to a write (program) request and an error occurring during erasure. The storage controller 400 detects the failure by a response such as a status error; however, write is possible as a result of the host 200 retrying, and thus, the write data is not lost. Even when an error occurs during erasing of the block, valid data is not lost. On the other hand, due to the UE during the reading, the data is lost as described above; however, failure notification process enables recovery of such data.

Second Embodiment

The storage system 100 of the present embodiment has a similar configuration to that of the storage system 100 of the first embodiment. Description proceeds mainly with a difference from the first embodiment, below. The storage system 100 of the present embodiment changes a capacity of the FMPK 300 in response to the occurrence of a failure in the FMPK 300.

In the flash memory, the greater the capacity of the update area, the smaller the frequency of reclamation, such that the performance is maintained. However, as the capacity of the update area is large, the capacity of an area (user area) where user data is stored is decreased. That is, depending on a ratio between the capacity of the user area and the capacity of the update area, a relationship is determined between a capacity of data to be stored in the FMPK 300 by the storage controller 400, and a performance. In the description and the drawings that follow, a capacity of the user area may be referred to as a "user capacity"; a capacity of the update area may be referred to as an "update capacity"; and a sum of the user capacity and the update capacity may be referred to as a "physical capacity". In the present embodiment, the user capacity and the update capacity may vary with the occurrence of the failure. In the present embodiment, a ratio between the user capacity and the update capacity is kept constant and the capacity is changed. As a result, it is possible to maintain a performance even when the capacity is reduced.

A correlation of the storage area in the storage system 100 will be described, below.

Figure 16:
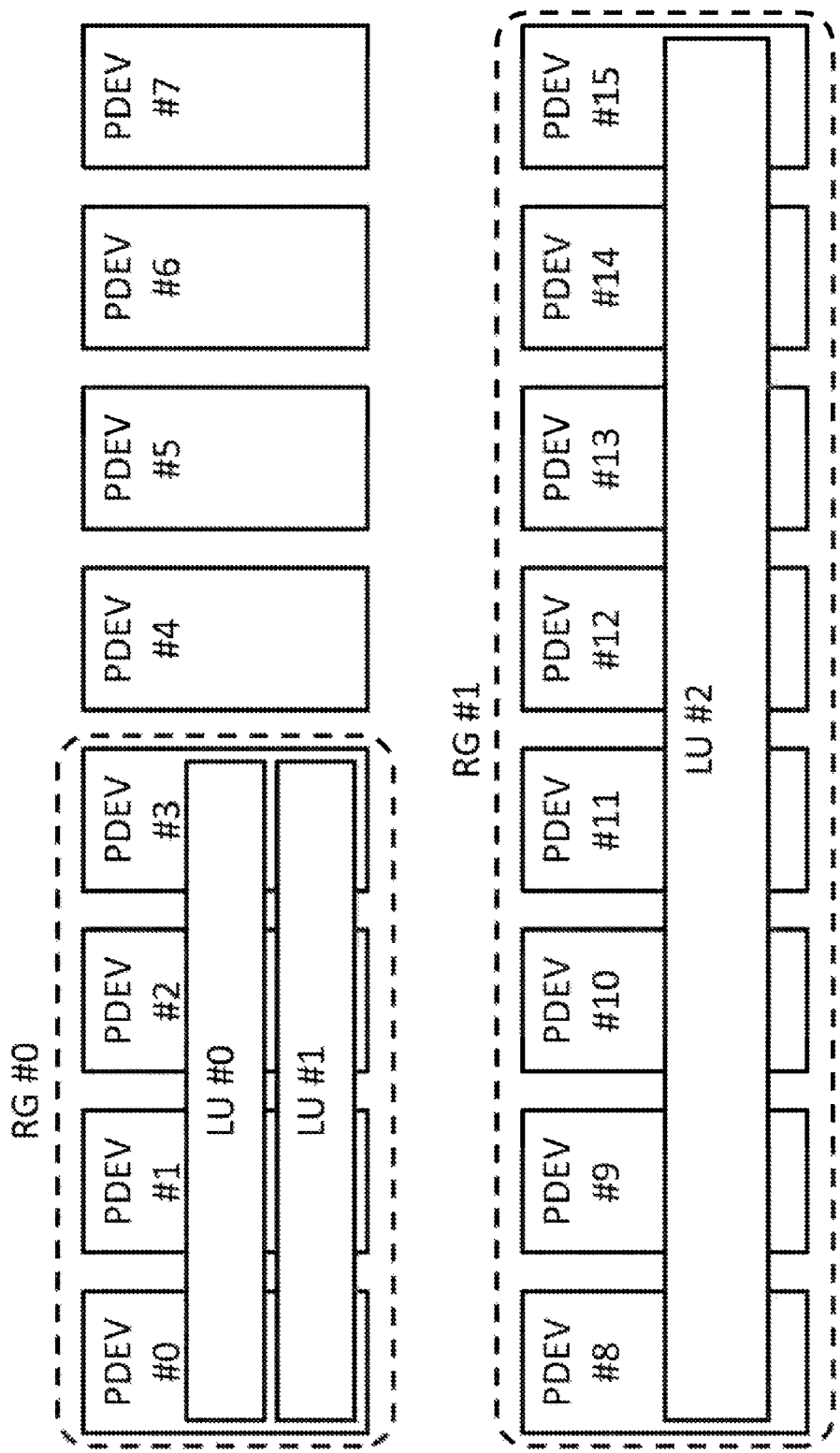
FIG. 16 shows configurations of an RG and an LU (Logical Unit) in a storage system 100.

FIG. 16 shows configurations of an RG and an LU (Logical Unit) in the storage system 100.

The storage controller 400 constructs an RG by using a plurality of PDEVs. In an example shown in this figure, the storage controller 400 constructs an RG #0 by using PDEVs #0 to #3 from among PDEVs #0 to #15 and constructs an RG #1 by using PDEVs #8 to #15. Each RG has a plurality of stripes. Each stripe straddles over the plurality of PDEVs and includes a plurality of data and a parity formed of the plurality of data. In a case of RAID 5, for example, arrangements of the data and the parity in the plurality of PDEVs differ on each stripe. In a configuration of the RAID 5 having 3+1P, one stripe includes three data and a parity formed of the three data. The storage controller 400 creates the parity. Further, the storage controller 400 allocates the storage area in the RG, to the LU. In the example shown in this figure, the storage controller 400 allocates the RG #0 to LUs #0 and #1 and allocates the RG #1 to an LU #2.

Figure 17:
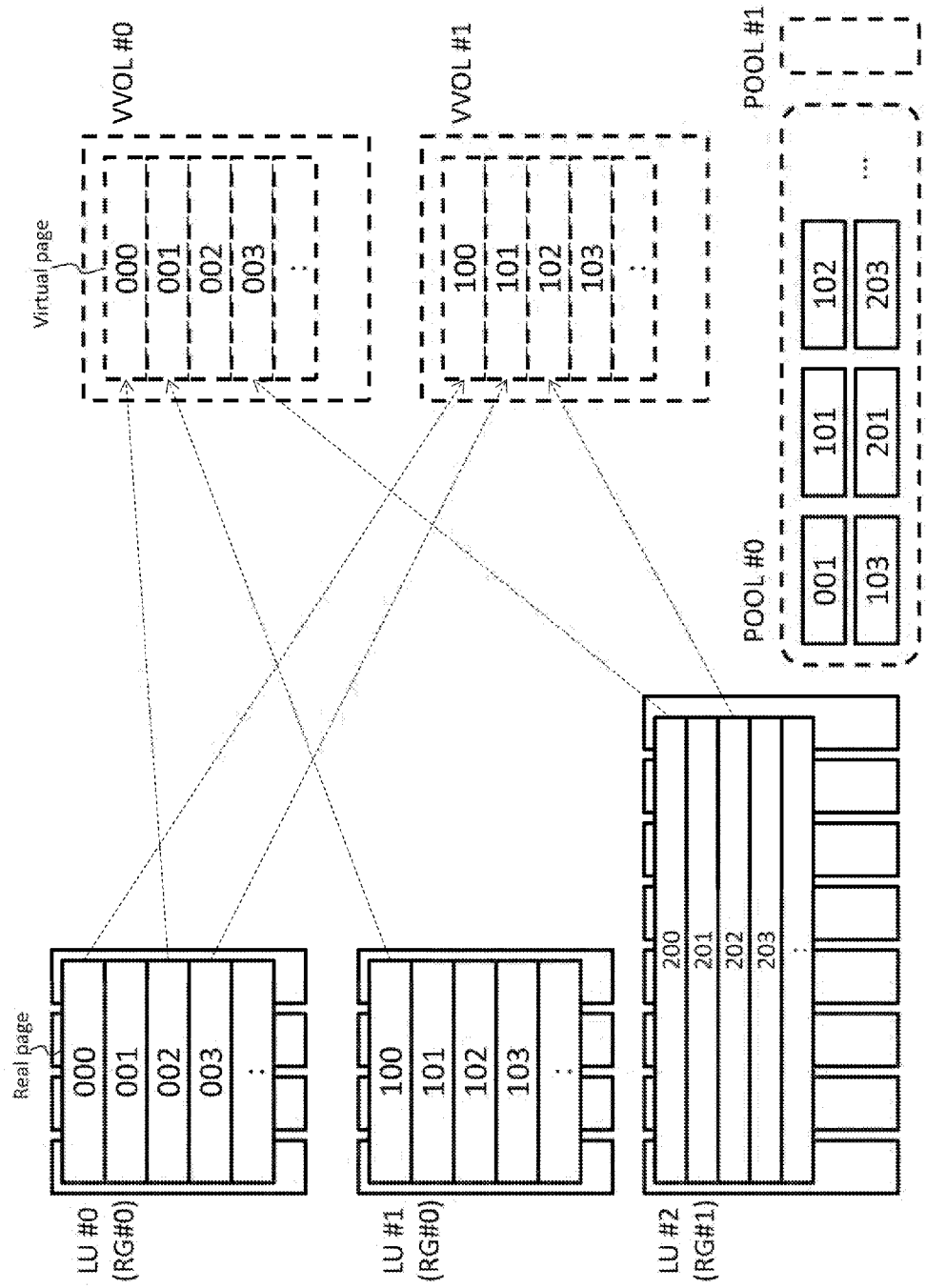
FIG. 17 shows configurations of an LU and a VVOL (Virtual Volume) in a storage system 100.

FIG. 17 shows configurations of an LU and a VVOL (Virtual Volume) in the storage system 100.

The storage controller 400 manages an LU by dividing the LU into a real page that is a logical storage area having a predetermined size. The storage controller 400 manages the real page by registering the real page in a pool. The storage controller 400 provides the host computers 200 with a VVOL. The storage controller 400 manages a virtual address space by dividing the virtual address space in the VVOL into a virtual page that is a virtual storage area having a predetermined size. The storage controller 400 uses a Thin Provisioning function to allocate, in response to a write request from the host computer 200, the real page from the pool to the virtual page including a range of addresses in the VVOL designated in the write request. When the allocation of the real page to the virtual page is canceled, the storage controller 400 returns the real page to the pool. In the example of this figure, the storage controller 400 registers the real pages in the LUs #0 to #2 in pools #0 and #1. Further, the storage controller 400 allocates the real pages in the pools #0 and #1 to the virtual pages in VVOLs #0 and #1.

Information managed by the storage system 100 will be described below.

Figure 18:
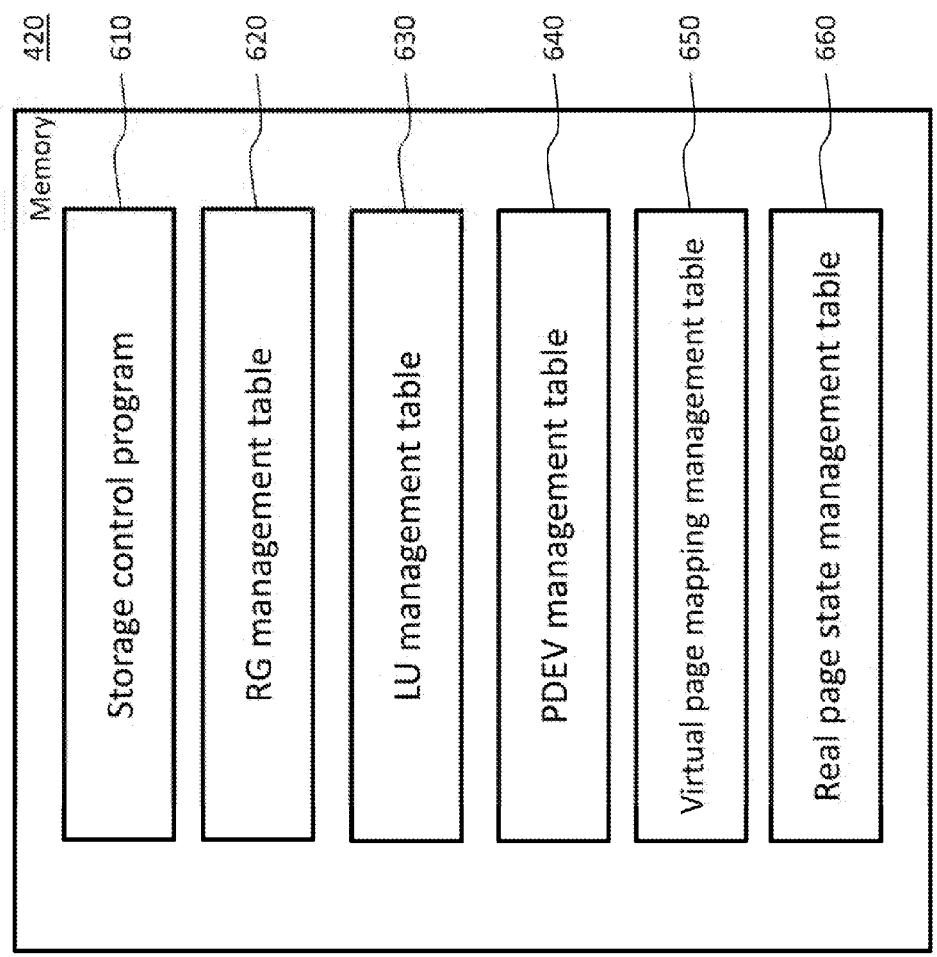
FIG. 18 shows information stored in a memory 420 of a storage controller 400.

FIG. 18 shows information stored in the memory 420 of the storage controller 400.

The memory 420 stores: a storage control program 610; an RG management table 620; an LU management table 630; a PDEV management table 640; a virtual page mapping management table 650; and a real page state management table 660.

The storage control program 610 is a program for causing the CPU 410 to execute the control of the storage system 100.

FIG. 19 shows the RG management table 620.

The RG management table 620 has an entry for each RG. The entry of a certain RG has: an RG number (RG #) 621 indicating the RG; a PDEV number (PDEV #) 622 indicating the PDEV belonging to the RG; a RAID level 623 for the RG; a PDEV classification 624 that is a classification of the PDEV belonging to the RG; and a PDEV minimum capacity 625 that is a minimum value of the user capacity of the PDEV belonging to the RG.

FIG. 20 shows the LU management table 630.

The LU management table 630 has an entry for each LU. The entry of a certain LU has: an LU number (LU #) 631 indicating the LU; an RG number (RG #) 632 indicating the RG allocated to the LU; a stripe size 633 for the LU; an LU start address 634 that is a start address of the LU in the logical address space in the RG; and an LU size 635 that is a size of the LU.

FIG. 21 shows the virtual page mapping management table 650.

The virtual page mapping management table 650 has an entry for each of virtual pages. The entry of a certain virtual page has: a VVOL number (VVOL #) 651 indicating the VVOL to which the virtual page belongs; a virtual page ID 652 indicating the virtual page; and a real page ID 653 indicating the real page allocated to the virtual page. When no real page is allocated to the virtual page, the real page ID 653 indicates "Unallocated". The virtual page ID 652 is a unique identifier in the storage system 100. The real page ID 653 is a unique identifier in the storage system 100.

FIG. 22 shows the real page state management table 660.

The real page state management table 660 has an entry for each real page. The entry of a certain real page has: a pool number (POOL #) 661 indicating the pool to which the real page belongs; a real page ID 662 indicating the real page; and a state 663 of the real page. The state 663 indicates whether the real page is allocated (in use) to the virtual page.

FIG. 23 shows the PDEV management table 640.

The PDEV management table 640 has an entry for each PDEV. The entry of a certain PDEV has: a PDEV number (PDEV #) 641 indicating the PDEV; a current user capacity 642 that is a current user capacity of the PDEV; an initial user capacity 643 that is an initial user capacity of the PDEV; a start address 644 of the user area in the logical address space (FMPK logical address space) of the PDEV; and a terminal address 645 of the user area in the logical address space of the PDEV. The FMPK logical address space is expressed by, for example, an LBA (Logical Block Address).

Figure 24:
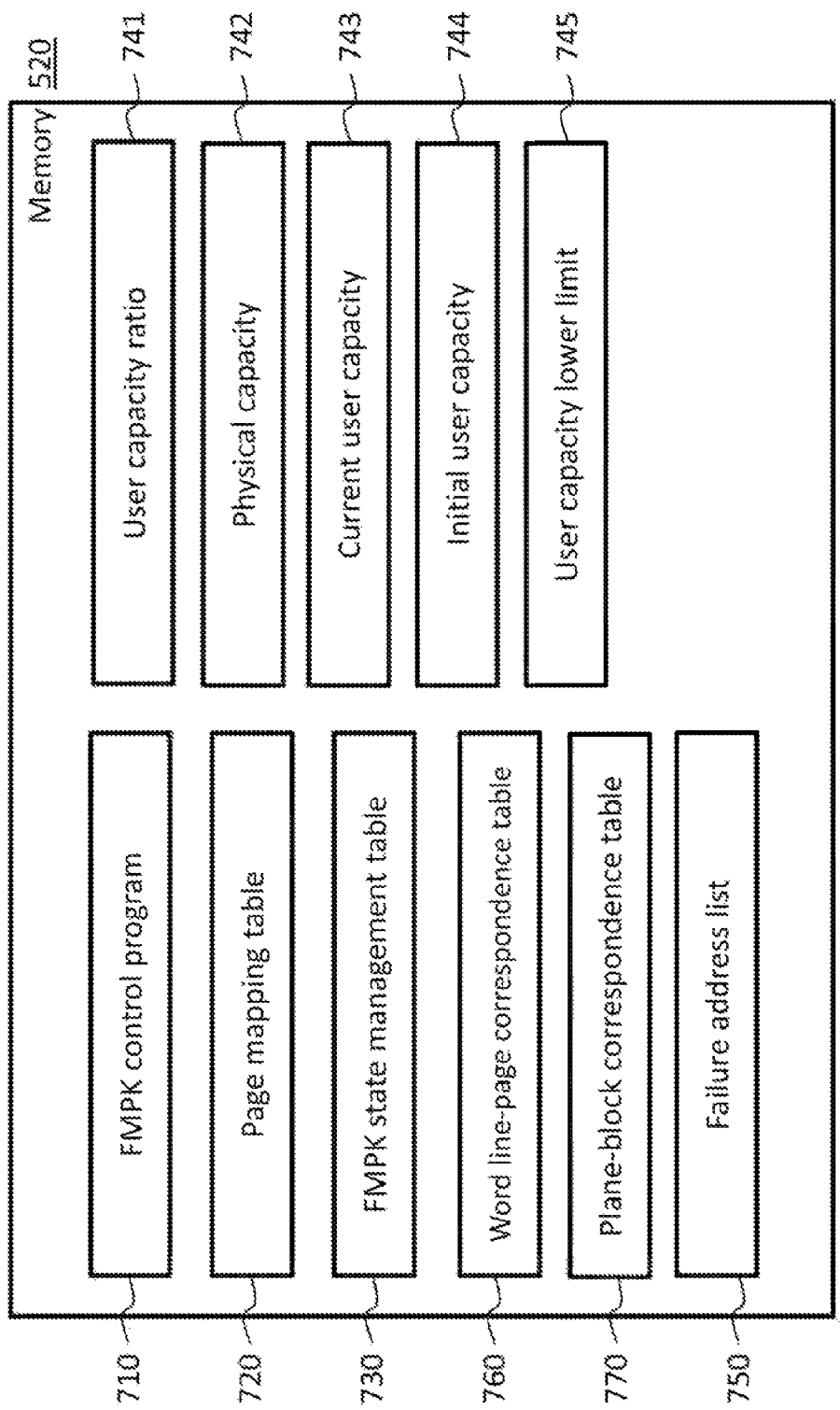
FIG. 24 shows information stored in a memory 520 of an FM-CTL 500 according to a second embodiment.

FIG. 24 shows information stored in the memory 520 of the FM-CTL 500 of the second embodiment.

In comparison with the information stored in the memory 520 of the first embodiment, the memory 520 according to the present embodiment further stores a user capacity ratio 741, a physical capacity 742, a current user capacity 743, an initial user capacity 744, and a user capacity lower limit 745. The user capacity ratio 741, the physical capacity 742, the initial user capacity 744, and the user capacity lower limit 745 are previously determined and stored in the memory 520. The current user capacity 743, which is equal to the initial user capacity 744 at the time of starting the operation, decreases once the failure occurs in the storage area in the FMPK 300. The user capacity ratio 741 is a ratio of the current user capacity 743 relative to all capacities of the storage area (the user area and the update area) where no failure is found. In the present embodiment, the user capacity ratio 741 is constant.

An operation of the storage system 100 will be described below.

Figure 25:
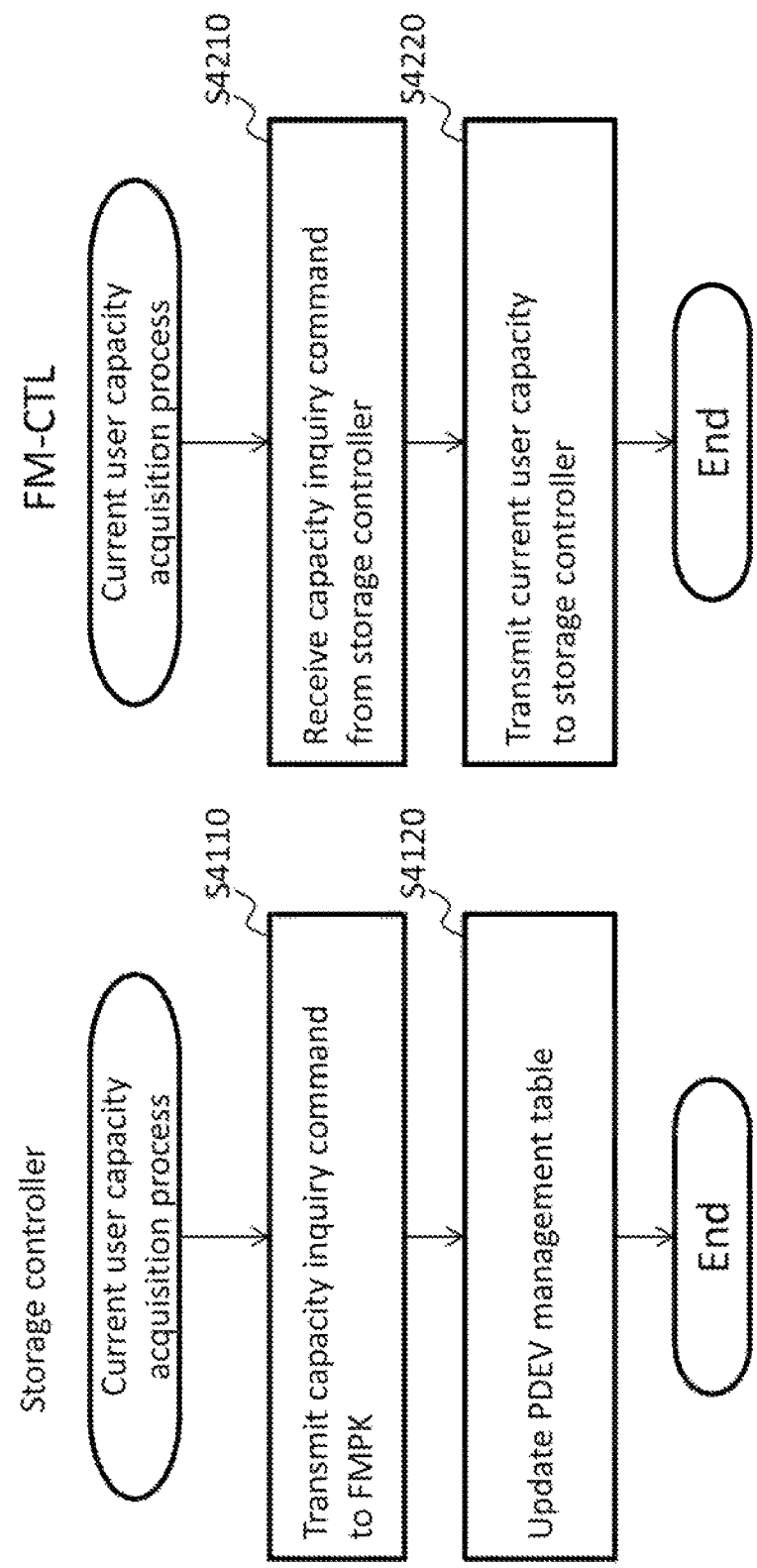
FIG. 25 shows current user capacity acquisition process.

FIG. 25 shows current user capacity acquisition process.

The storage controller 400 executes the current user capacity acquisition process for acquiring a current user capacity of a target FMPK. When installing the FMPK 300 into the storage system 100, the storage controller 400 acquires the current usex capacity when the FMPK 300 is regarded as the target FMPK. The storage controller 400 may regularly perform current user capacity updating process.

By transmitting a capacity query command to the target FMPK, the storage controller 400 receives the current user capacity from the target FMPK (S4110), updates the current user capacity 642 of the target FMPK in the PDEV management table 640 by the received current user capacity (54120), and then, ends the process.

Upon receipt of the capacity query command from the storage controller 400 (S4210), the FM-CTL 500 transmits the current user capacity 743 in the memory 520 to the storage controller 400 (S4220), and then, ends the process. Thus, the current user capacity acquisition process is described.

According to the current user capacity acquisition process the storage controller 400 is capable of acquiring the current user capacity of the FMPK 300.

Figure 26:
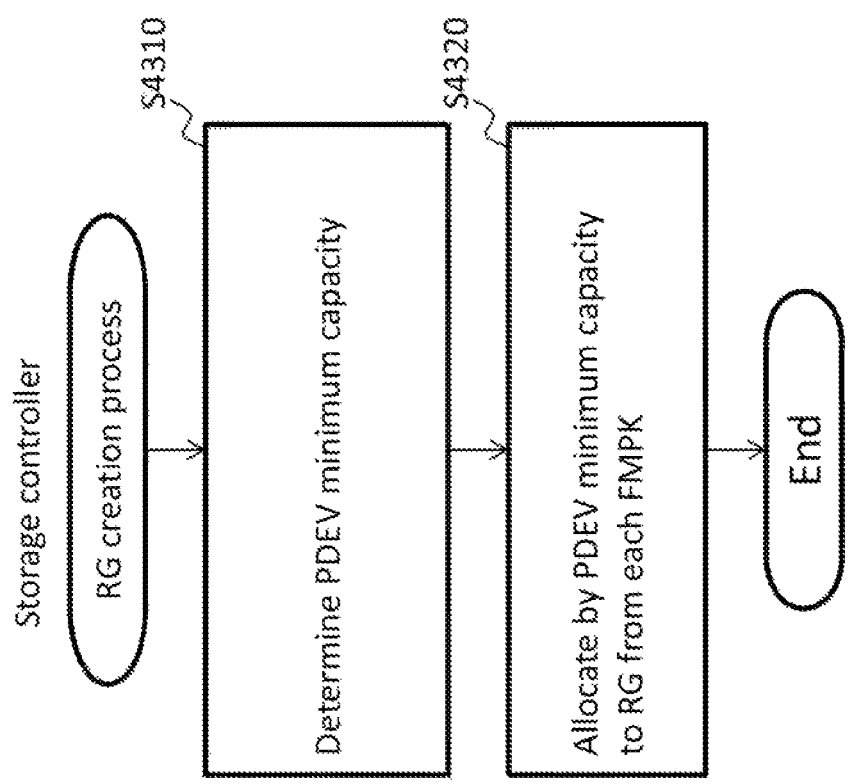
FIG. 26 shows RG creation process.

FIG. 26 shows RG creation process.

When creating a new RG by using a plurality of FMPKs 300, the storage controller 400 determines a capacity used for the RG for each of the plurality of FMPKs 300, and executes the RG creation process for creating the RG.

The storage controller 400 detects a minimum value of the current user capacity 642 of the FMPK 300 belonging to the RG from the PDEV management table 640, and uses the same as a PDEV minimum capacity of the RG (S4310). Subsequently, the storage controller 400 creates the RG by using a logical address area by the PDEV minimum capacity in each of all the FMPKs 300 belonging to the RG, inputs the PDEV minimum capacity into the PDEV minimum capacity 625 of the RG in the RG management table 620 (S4320), and then, ends the process. Thus, the RG creation process is described. The storage controller 400 performs striping on data for the plurality of PDEVs belonging to the RG, and stores the same. In order that the data is subjected to striping and stored, each PDEV in the RG needs to have an available capacity having the same size. That is, when there is no available capacity in a certain PDEV, it is not possible to store the data even if there is an available capacity in another PDEV in the RG. Therefore, when a user capacity in a certain PDEV is reduced, it is not possible to store the data in the RG itself even if there is an available capacity in another PDEV in the RG. Therefore, the storage controller 400 creates the RG to match the PDEV minimum capacity.

According to the RG creation process, it is possible to create an RG having an appropriate capacity to match the current user capacity of the FMPK 300 belonging to the RG.

The storage controller 400 may detect a failure region by the failure notification process of the first embodiment at the time of a read request to the FMPK 300 or may detect a failure region by regular monitoring process.

Figure 27:
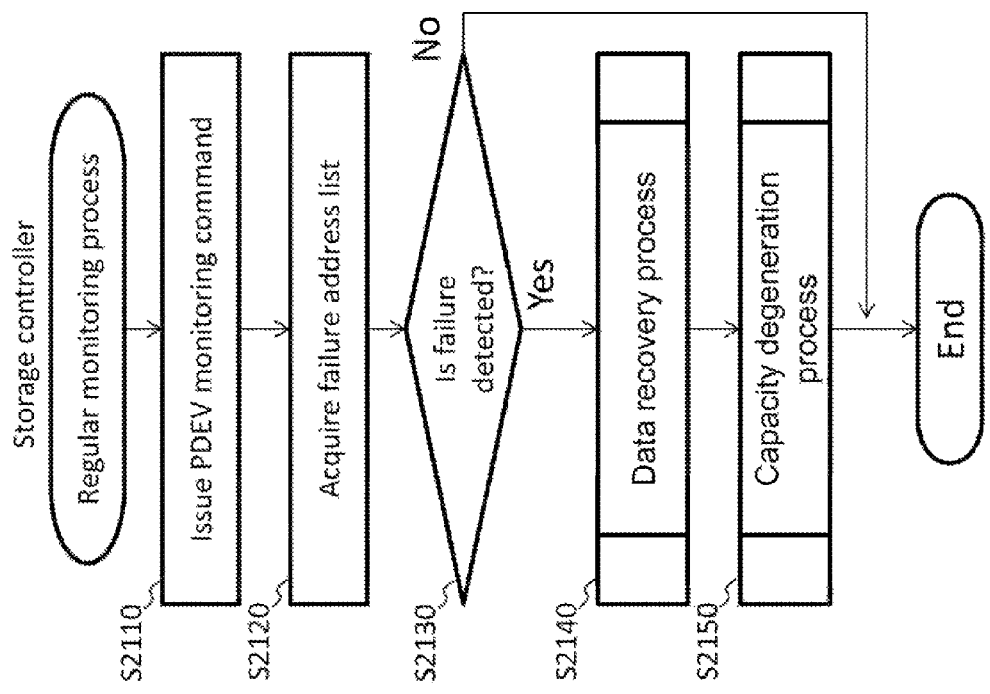
FIG. 27 shows regular monitoring process.

FIG. 27 shows the regular monitoring process.

The storage controller 400 regularly selects one FMPK 300 as a target FMPK and executes regular monitoring process for acquiring a state of the target PDEV. The storage controller 400 regularly executes the regular monitoring process on each of all the PDEVs.

The storage controller 400 issues a PDEV monitoring command, which is similar to the failure address list request of the first embodiment, to the target FMPK (S2110). The FM-CTL 500 that receives the PDEV monitoring command transmits, as a response to the PDEV monitoring command, the failure address list 750 to the storage controller 400. Consecutively, the storage controller 400 receives the failure address list 750 from the target FMPK (S2120). Subsequently, the storage controller 400 determines whether a failure is detected on the basis of the failure address list 750 (S2130). When it is determined that no failure is detected (S2130: No), the storage controller 400 ends this process. When it is determined that the failure is detected (S2130: Yes), the storage controller 400 recognizes the target FMPK as a failed FMPK, executes data recovery process for recovering the data lost in the failed FMPK (S2140); recognizes the RG to which the failed FMPK belongs as a failed RG, executes capacity degeneration process for reducing the user capacity of the FMPK 300 belonging to the failed RG (S2150); and ends this process. The data recovery process and the capacity degeneration process will be described, below. Thus, the regular monitoring process is described.

It is noted that when a failure occurs and the failure address list 750 is created in die diagnosis process, similarly to the first embodiment, the FM-CTL 500 may transmit a UA (Unit Attention) as a response to a Read command and a Write command, to the storage controller 400 to thereby notify the storage controller 400 that the failure occurs. In this case, the storage controller 400 may acquire the failure address list 750 by using the PDEV monitoring command. In accordance with a rule previously determined for the storage controller 400 and the FM-CTL 500, the FM-CTL 500 may notify the storage controller 400 of the failure area. For example, the FM-CTL 500 detects a failure for each logical address area having a report size (for example, 256 kB) that is a previously determined size, and transmits only a start address (LBA) of the logical address area where the failure is detected, to the storage controller 400. The storage controller 400 that receives the start address recovers data in the logical address area having the report size specified by the start address.

Figure 28:
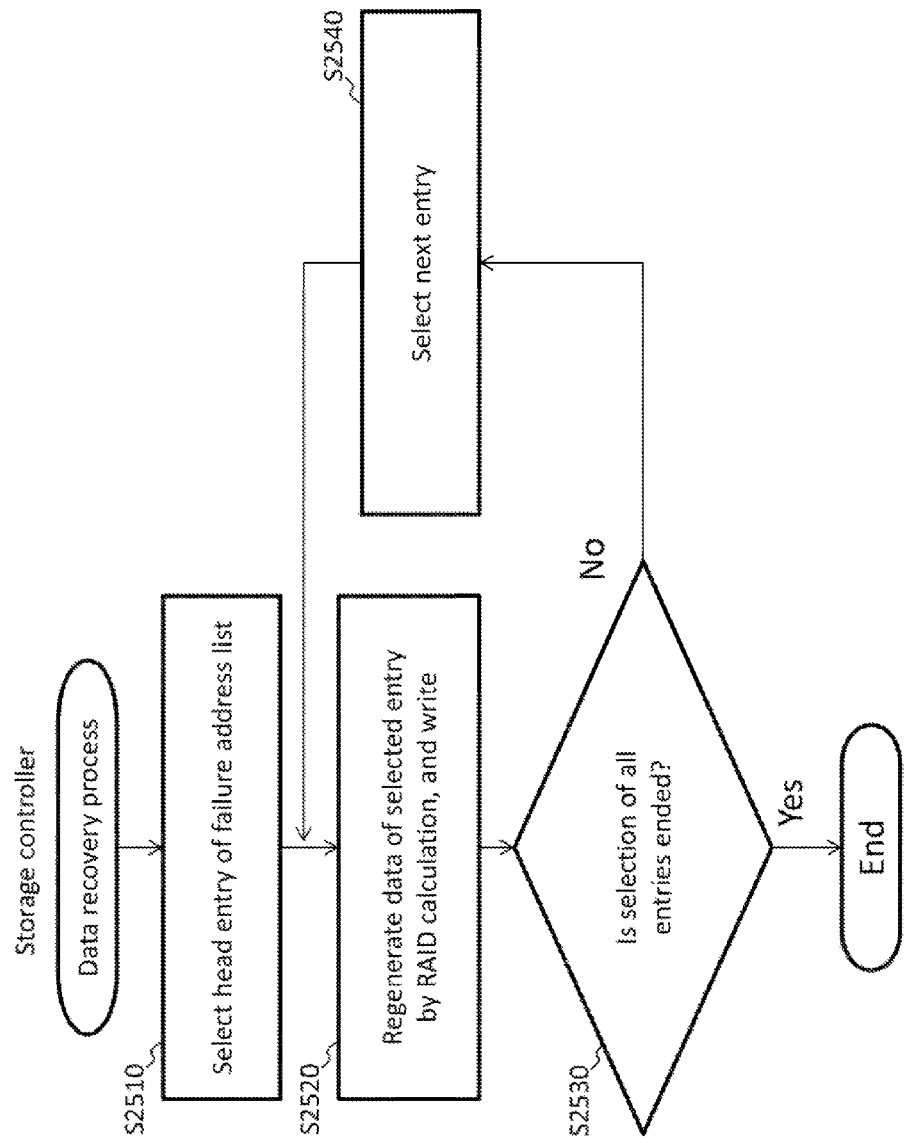
FIG. 28 shows data recovery process.

FIG. 28 shows data recovery process.

At the above-described S2140, the storage controller 400 executes the data recovery process.

The storage controller 400 selects one entry in order from the head of the failure address list 750 acquired from the failed FMPK and recognizes a failure area from the selected entry (S2510). Subsequently, the storage controller 400 specifies the FMPK 300 other than the failed FMPK belonging to the failed RG, on the basis of the RG management table 620, specifies a stripe corresponding to the failure area on the basis of the LU management table 630, reads the data or the parity of the specified FMPK 300 of the specified stripe, and executes RAID calculation, whereby the data (failure data) lost in the failure area is regenerated, and writes the regenerated data into the failure area of the failed FMPK (S2520). In response to the process, the FM-CTL 500 of the failed FMPK allocates a normal physical storage area to the failure area and writes the data into the physical storage area from the storage controller 400. Subsequently, the storage controller 400 determines whether the selection of all the entries of the acquired failure address list 750 is ended (S2530). When it is determined that the selection of all the entries is ended (S2530: Yes), the storage controller 400 ends the process. Otherwise, the storage controller 400 shifts the process to S2510. Thus, the data recovery process is described.

According to the data recovery process, it is possible to recover the data stored in a portion where the failure occurs in the failed FMPK. The FM-CTL 500 specifies the logical address area where the failure occurs and notifies the storage controller 400 of the area, whereby the storage controller 400 is capable of recovering the data related to a specified address range. As a result, when the address range is not specified, it is necessary to recover the data in all the logical address areas in the failed FMPK, and thus, in the data recovery process, it is possible to shorten a time for recovering the data.

Figure 29:
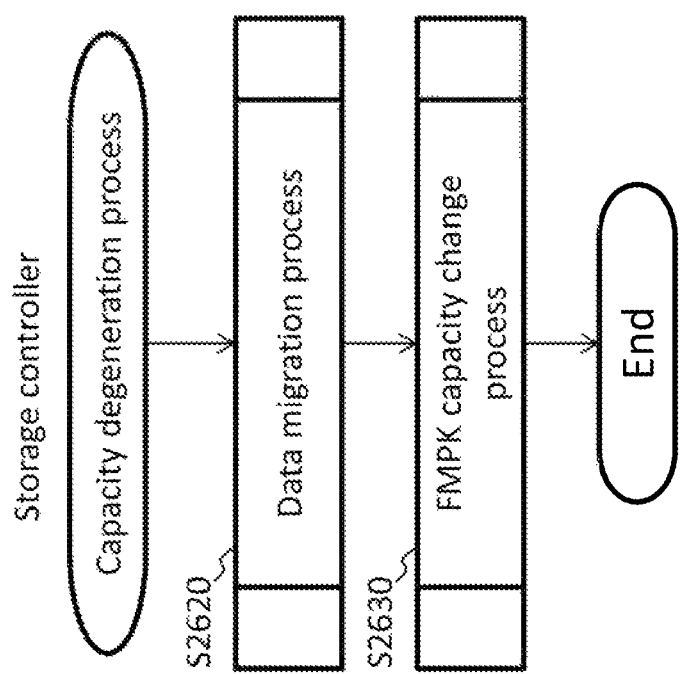
FIG. 29 shows capacity degeneration process.

FIG. 29 shows capacity degeneration process.

At the above-described S2150, the storage controller 400 executes the capacity degeneration process.

The storage controller 400 executes data migration process for migrating the data in the logical address area to be reduced in the failed RG (S2620), executes FMPK capacity change process for changing the capacity of the FMPK 300 belonging to the failed RG (S2630), and ends this process. The data migration process and the FMPK capacity change process will be described later. Thus, the capacity degeneration process is described.

Figure 30:
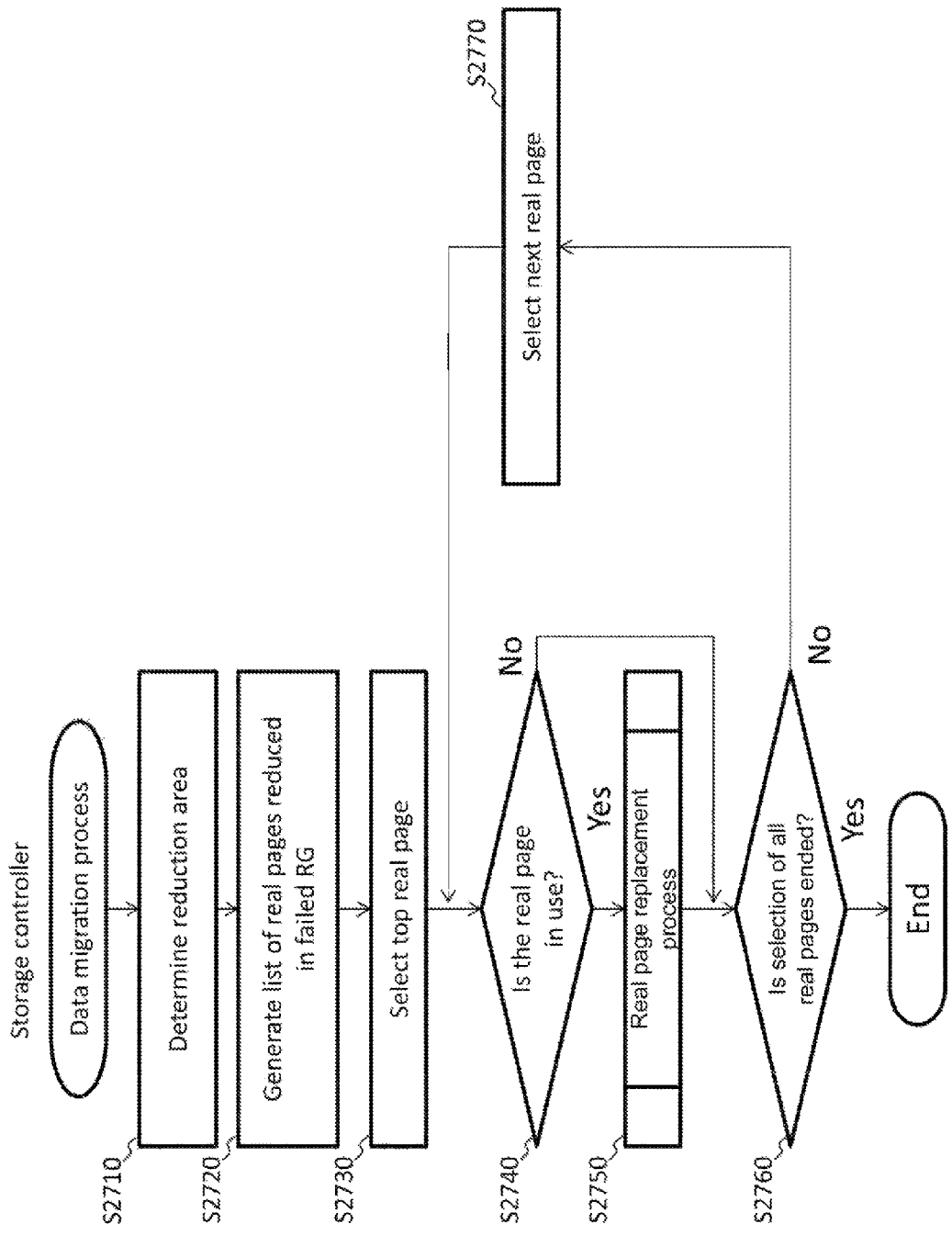
FIG. 30 shows data migration process.

FIG. 30 shows data migration process.

At the above-described S2620, the storage controller 400 executes the data migration process.

The storage controller 400 determines a reduction area that is a logical address area to be reduced from the failed FMPK (S2710). Here, the storage controller 400 determines a reduction size that is a size of the reduction area, and a start address (LBA) of the reduction area. The reduction area is an address range by the reduction size, preceding from the terminal address 645 of each FMPK 300, in the PDEV management table 640, for example. That is, reducing the capacity means to limit the logical address area of the FMPK 300 available for the storage controller 400. For example, the storage controller 400 transmits an inquiry for a normal area capacity to the failed FMPK. The FM-CTL 500 that receives the inquiry for the normal area capacity calculates a value obtained by multiplying the capacity (physical capacity 742) of the physical storage area from which the current defective part is removed, by the user capacity ratio, as a normal region capacity, and transmits the normal area capacity to the storage controller 400. The defective part is a Bad Block (defective block), for example. It is noted that the FMPK 300 of the present embodiment closes a die when all the allocated blocks in the die are the Bad Blocks, and does not close the die even when a part of the allocated blocks in the die are the Bad Blocks. Accordingly, in the FMPK 300, the capacities of all the Bad Blocks may differ from the capacity of the closed part. Therefore, the defective part may be the closed part. The storage controller 400 that receives the normal region capacity calculates, as the reduction size, a value obtained by reducing the normal area capacity from the current user capacity 642 of the failed FMPK.

Subsequently, the storage controller 400 specifies an RG reduction range that is the logical address area of the stripe corresponding to the reduction area in the RG including the failed FMPK, on the basis of the RG management table 620, the LU management table 630, and the PDEV management table 640, and creates a list of all the real pages within the RG reduction range (S2720). The size of the RG reduction range differs depending on each RAID level 623 of the failed RG in the RG management table 620. For example, when the RAID level 623 of the failed RG is 0, 5, or 6, the size of the RG reduction range is a value obtained by multiplying the reduction size by the number of data disks (a value obtained by eliminating the number of parity disks from the total number of disks belonging to the failed RG). Moreover, when the RAID level 623 of the failed RG is 1, the size of the RG reduction range is the reduction size.

The storage controller 400 manages the storage area of the RG real page by real page, and thus, reduces the size of the RG real page by real page. Here, the storage controller 400 does not simply regard the size of the failure area notified from the FMPK 300 as the reduction size; the storage controller 400 determines the reduction size on the basis of information of the real page. When the size of the failure area includes a fraction by the real page, the storage controller 400 calculates the reduction size obtained by rounding up the size of the failure area to an integral multiplication of the real page. The storage controller 400 manages the information of the real page, and the FMPK 300 does not manage the information of the real page. Accordingly, the storage controller 400 needs to notify the FMPK 300 of the reduction size by way of FMPK capacity change process described later.

Subsequently, the storage controller 400 selects the top real page from the list of the real pages within the RG reduction range (S2730). Thereafter, the storage controller 400 determines whether the real page is in use (allocated to the virtual page) on the basis of the real page state management table 660 (S2740). When it is determined that the real page is not in use (S2740: No), the storage controller 400 shifts process to S2760. This is because when no real page is allocated to the virtual page, it is not necessary to copy the data. When it is determined that the real page is in use (S2740: Yes), the storage controller 400 uses a Thin Provisioning function to execute real page replacement process for replacing the real page, as the replacement source real page, to another real page (S2750). The real page replacement process will be described later. Subsequently, the storage controller 400 determines whether the selection of all the real pages in the list of the real pages is ended (S2760). When the selection of all the real pages within the RG reduction range is not ended (S2760: No), the storage controller 400 selects a next real page from the list of the real pages (S2770), and shifts process to S2740. When the selection of all real pages within the RG reduction range is completed (S2760: Yes), the storage controller 400 ends this process. Thus, the data migration process is described.

Figure 31:
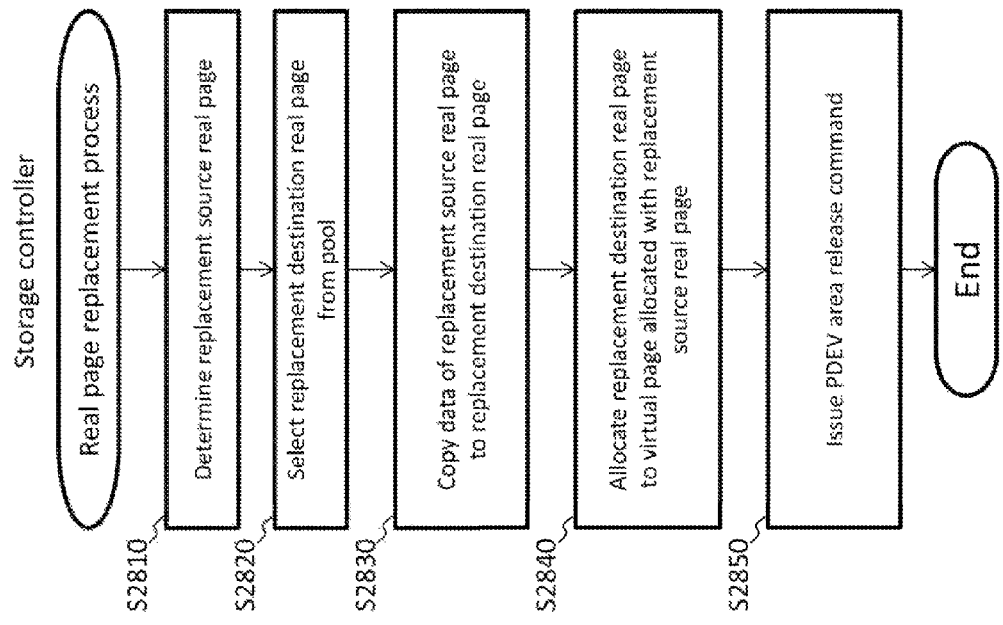
FIG. 31 shows real page replacement process.

FIG. 31 shows the real page replacement process.

At the above-described S2750, the storage controller 400 executes the real page replacement process.

The storage controller 400 determines that the selected real page is the replacement source real page (S2810). Subsequently, the storage controller 400 selects a replacement destination real page from a pool including an unused real page, on the basis of the real page state management table 660 (S2820). Here, the storage controller 400 may select a real page other than the failed RG from among the real pages in the pool. Subsequently, the storage controller 400 copies data of the replacement source real page onto the replacement destination real page (S2830).

Subsequently, the storage controller 400 allocates the replacement destination real page to a virtual page to which the replacement source real page is allocated (S2840). Here, the storage controller 400 changes a replacement source real page ID to a replacement destination real page ID in the virtual page mapping management table 650, changes the state 663 of the replacement source real page to "unused" in the real page state management table 660, and changes the state 663 of the replacement destination real page to "in-use".

Thereafter, the storage controller 400 issues, to the target FMPK, a PDEV area release command for notifying that the logical page allocated to the replacement source real page in the target FMPK is unused (S2850), and ends this process. In other words, the PDEV area release command notifies that the target FMPK may discard the data of the logical page. Thus, the real page replacement process is described.

Figure 32:
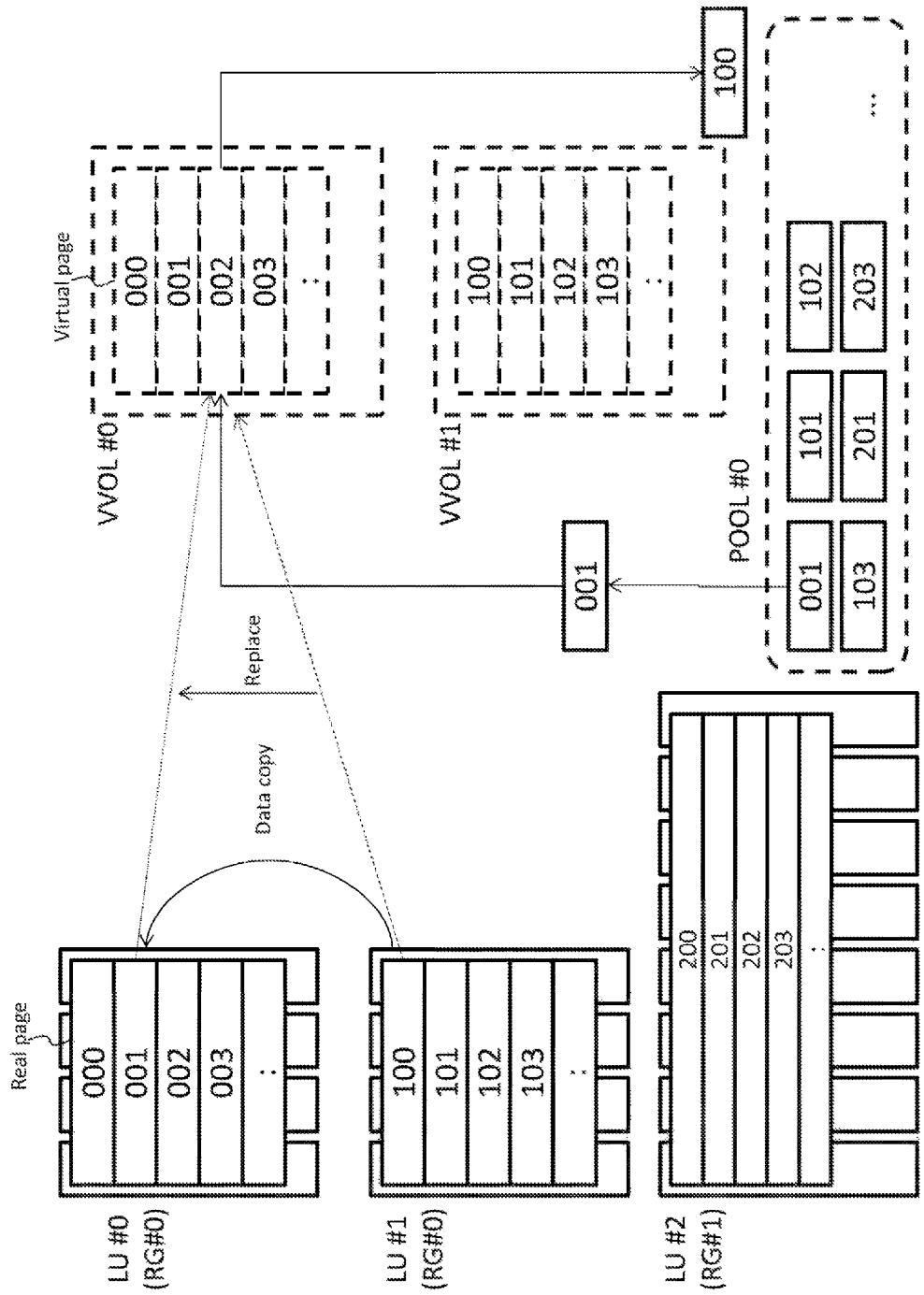
FIG. 32 schematically shows real page replacement process.

FIG. 32 schematically shows the real page replacement process.

In the real page replacement process in this figure, a real page #100 is selected as the replacement source real page, and the replacement source real page is allocated to a virtual page #002. Subsequently, a real page #001 is selected as the replacement destination real page from the pool #0, and the replacement destination real page is allocated to the virtual page #002.

According to the real page replacement process, it is possible to allocate the real page from the pool to the virtual page allocated with the real page reduced in the failed RG. This makes it possible to change all real pages, to be reduced in the failed RG, to an unused state, while reducing the capacity of the failed RG.

According to the data migration process, on the basis of the current user capacity and the capacity of the physical storage area in the failed FMPK where the failure occurs, it is possible to determine a reduction area. Further, the data stored in the real page corresponding to the reduction area of the failed FMPK is migrated, and in addition, a real page of a migration destination is allocated to the virtual page allocated with the real page. As a result, it is possible to maintain an access to an address included in the virtual page from the host computer 200.

Figure 33:
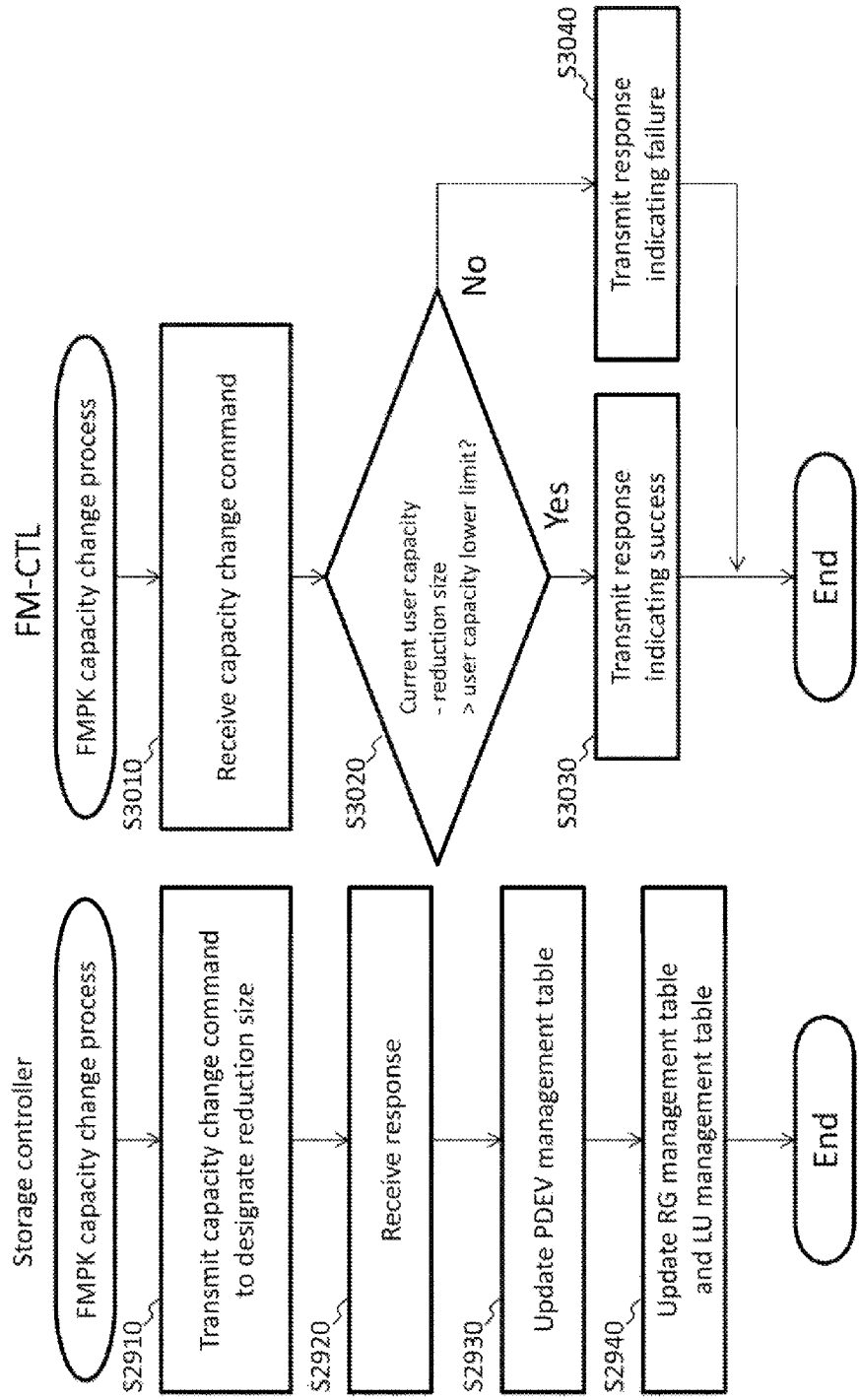
FIG. 33 shows FMPK capacity change process.

FIG. 33 shows the FMPK capacity change process.

At the above-described S2630, the storage controller 400 executes the FMPK capacity change process on the target FMPK, that is, each of all the FMPK 300 belonging to the failed RG.

The storage controller 400 transmits a capacity change command for designating a reduction size, to the target FMPK (S2910), and receives a response thereto (S2920). Subsequently, the storage controller 400 updates an entry of the target FMPK in the PDEV management table 640 (S2930). Here, the storage controller 400 changes a stored value to a value obtained by subtracting the reduction size from the stored value in the current user capacity 642 of the target FMPK. Further, the storage controller 400 changes the stored value to the value obtained by subtracting the reduction size from the stored value in the terminal address 645.

Subsequently, the storage controller 400 updates the RG management table 620 and the LU management table 630 (S2940), and ends this process. Here, the storage controller 400 updates the PDEV minimum capacity 625 of the RG management table 620 and the LU size 635 of the LU management table 630 on the basis of the updated current user capacity 642. As a result, the replacement source real page returned to the pool in the page replacement process is deleted from the pool.

Upon receipt of the capacity change command from the storage controller 400 (S3010), the FM-CTL 500 calculates, as an already-reduced user capacity, a value obtained by subtracting the reduction size designated in the capacity change command from the current user capacity 743 in the memory 520, and determines whether the already-reduced user capacity is greater than the user capacity lower limit 745 in the memory 520 (S3020). When it is determined that the already-reduced user capacity is greater than the user capacity lower limit 745 (S3020), the FM-CTL 500 changes the value of the current user capacity 743 to the already-reduced user capacity, transmits a response indicating a success for the capacity change command, to the storage controller 400 (S3030), and ends this process. Otherwise (S3020: No), the FM-CTI, 500 transmits a response indicating a failure for the capacity change command, to the storage controller 400 (S3030), and ends this process. When receiving the response indicating the failure from the FMPK 300, the storage controller 400 closes a whole of the FMPK 300. That is, when the user capacity of the FMPK 300 is equal to or less than the user capacity lower limit 745 due to the FMPK capacity change process, the FMPK 300 is closed. Thus, the FMPK capacity change process is described.

Generally, when a capacity of a volume of an access destination is changed, the host computer 200 needs to stop an operation to recognize the volume again. In the present embodiment, when the capacity of the FMPK is reduced, the capacity of the pool is reduced. More specifically, the number of real pages included in the pool is reduced. The storage area is allocated to the virtual volume from the pool; however, the capacity of the virtual volume is not changed. As a result, the host computer 200 does not need to recognize the capacity reduction due to a partial failure inside the FMPK, and is capable of continuing an access to the virtual volume.

In the following description and drawings, the FMPK 300 other than the failed FMPK belonging to the failed RG may be referred to as a "related FMPK", and a logical address area of the related FMPK corresponding to the stripe of the reduction area of the failed FMPK in the failed RG may be referred to as a "related area". According to the FMPK capacity change process, it is possible to reduce not only the reduction area of the failed FMPK but also the related area of the related FMPK.

According to the FMPK capacity change process, it is possible to allow the current user area reduced by the storage controller 400 to be reflected in the FMPK 300.

Figure 34:
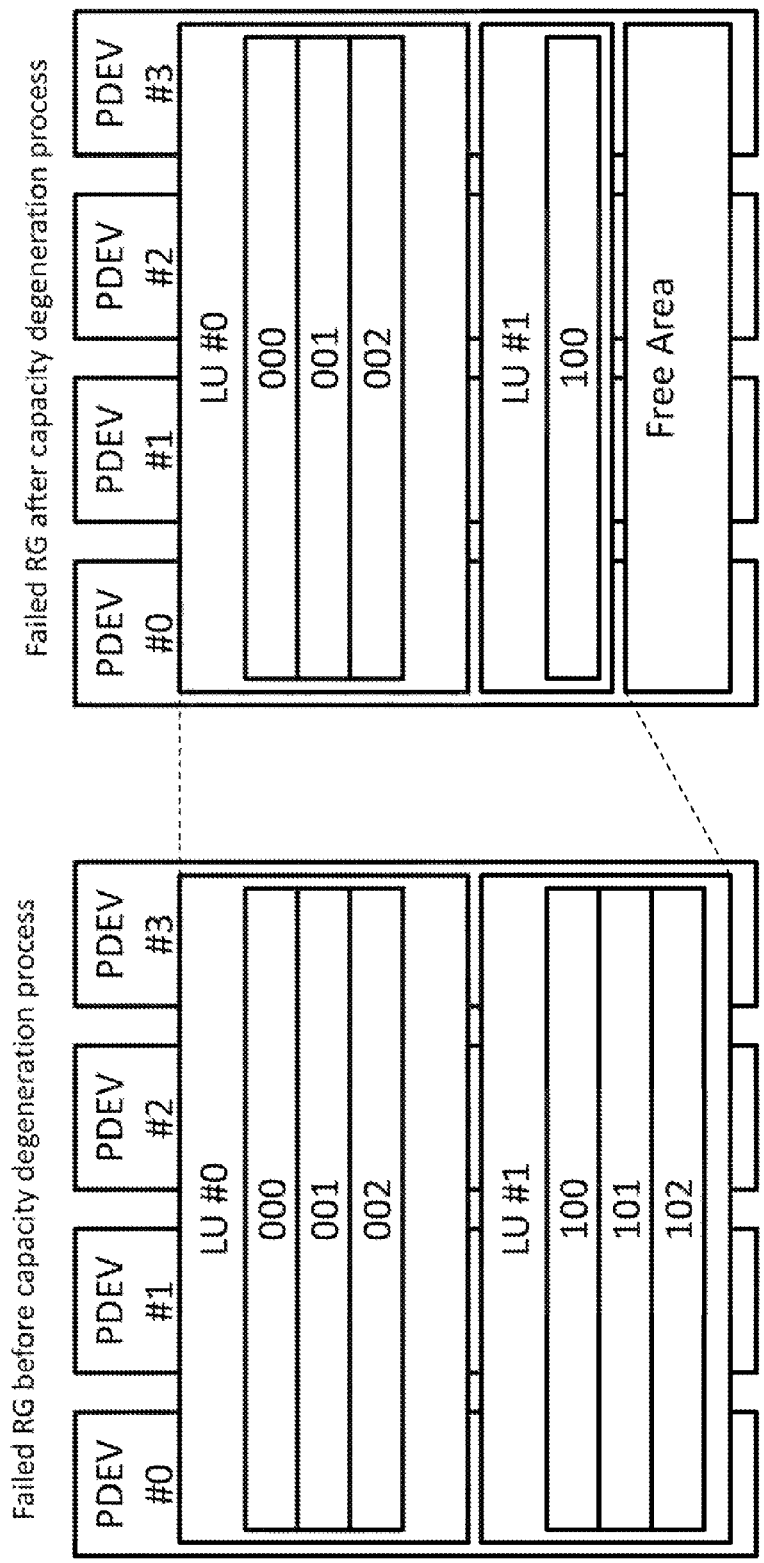
FIG. 34 schematically shows capacity degeneration process.

FIG. 34 schematically shows the capacity degeneration process.

This figure shows an arrangement of the real pages in the failed RG before the capacity degeneration process and an arrangement of the real pages in the RG after the capacity degeneration process. By the capacity degeneration process, in the FMPK 300 belonging to the failed RG, data stored in the real pages within the address range subsequent to the reduced user capacity is migrated to another real page. As a result, in all the FMPKs 300 belonging to the failed RG, the address range from the head to the current user capacity is allocated to the failed RG. Further, in all the FMPKs 300 belonging to the failed RG, the address range subsequent to the current user capacity is an unused area (Free Area) not used in the failed RG.

According to the capacity degeneration process, when the storage controller 400 migrates data stored in the real pages corresponding to the reduction area of the failed FMPK and allocates the real page in the pool to the virtual page to which the real page is allocated, it is possible to reduce the current user capacity of the failed FMPK. By reducing the reduction area and the related area, it is possible to reduce the capacity of the failed RG together with the current user capacity of the FMPK 300 belonging to the failed RG. Furthermore, the FM-CTL 500 is capable of reducing the current user capacity in accordance with an instruction from the storage controller 400.

According to the present embodiment, when the failure occurs in the FMPK 300, the storage controller 400 reduces the capacity of the FMPK 300 in accordance with the failure portion, whereby it is possible to prevent the whole of the FMPK 300 from being closed and it is possible to continue with the use of the FMPK 300. Moreover, it is possible to close a portion where a failure occurs, by DMA by DMA, chip by chip, die by die, or plane by plane in the FMPK 300. Further, when a failure occurs in one of a plurality of FMPKs 300 belonging to the RG, the storage controller 400 reduces the capacity of the RG to thereby continue the use of the RG.

It is noted that in the foregoing description, also, while information of the present invention is explained by expressions such as "aaa table" and "aaa list", this information may be expressed in terms of other data structures such as a DB and a queue. Thus, with a view to representing the absence of dependency on the data structures. "aaa table", "aaa list", "aaa DB", "aaa queue" or the like may be referred to as "aaa information".

Furthermore, when the content of each item of information is described, the expressions such as "identification information", "identifier". "title", "name", and "ID" are used; these are mutually replaceable.

In the foregoing description, the "program" may be used as the subject for description. However, the program is executed by the processor, thereby performing predetermined process by using memory and communication ports. Thus, the processor may be used as the subject for description. Additionally, the process disclosed with the program as the subject may also be executed by a management computer or an information process apparatus. Further, a part of or a whole of the program may be realized by a dedicated hardware.

Additionally, various programs may be installed onto each computer via a program distribution server or storage media that is readable by the computer.

The non-volatile semiconductor memory in the above-described embodiments is an FM (Flash Memory). The FM in the above embodiments is an FM of a type where data is erased block by block and data is read and written page by page, that is, typically, a NAND flash memory. However, when the FM is used, another type (NOR type, for example) of flash memory may be used instead of the NANI) type. Furthermore, in place of the FM, another type of non-volatile semiconductor memory, such as a semiconductor memory including an MRAM (Magnetoresistive random access memory) that is a magnetic resistive memory, a ReRAM (Resistance random access memory) that is a resistive variation type memory, and a FelRAM (Ferroelectric random access memory) that is a ferroelectric memory, and a phase change memory may be used.

As a memory device, the FMPK 300, for example, may be used. As a non-volatile semiconductor memory, the FM chip 570, for example, may be used. As a host apparatus, the storage controller 400 or the host computer 200, for example, may be used. As a device controller, the FM-CTL 500, for example, may be used. As a storage circuit, the plane 572 or the die 571 in the FM chip 570, for example, may be used. As a control circuit, the row decoder 573, the sense amplifier 574, and the peripheral circuit 575 in the die 571, for example, may be used. As a block, the block 581, for example, may be used. As a page, the page 583, for example, may be used. As an I/O, the read or write, for example, may be used. As a diagnosis process, the die diagnosis process or the plane diagnosis process, for example, may be used. As a part of a block in the specific storage circuit, the UE block at S520 or the target block at S720, for example, may be used. As a logical address, the LBA, for example, may be used. As a physical address, the physical page identifier, for example, may be used. As failure information, the failure address list 750, for example, may be used. As a specific block, the UE block, for example, may be used. As a distribution condition, establishment of NO at S540, for example, is may be used. As a semiconductor substrate, the die 571 in the FM chip 570, for example, may be used, as a storage circuit, the plane 572 in the die 571, for example, may be used, as a specific storage circuit, the plane to be diagnosed, for example, may be used, and as an additional storage circuit, the additional plane to be diagnosed, for example, may be used. As a page row, the page row coupled to the word line 582, for example, may be used. As a response for requesting to not count a UE on the basis of a read request, a special UE response, for example, may be used. As a storage apparatus, the storage system 100, for example, may be used. As a storage controller, the storage controller 400, for example, may be used. As a capacity of a logical storage area, the user capacity, for example, may be used.

The present invention is not limited to the aforementioned embodiments, and may be changed into other various formats providing it does not deviate from scope of its original intent.

REFERENCE SIGNS LIST

100 . . . storage system, 200 . . . host computer, 300 . . . FMPK, 310 . . . memory module, 400 . . . storage controller, 410 . . . CPU, 420 . . . memory, 500 . . . FM-CTL, 510 . . . CPU, 520 . . . memory, 541 . . . DMA controller, 570 ... FM chip, 571 ... die, 572 ... plane, 581 ... block, 582 ... word line, 583 ... page

The invention claimed is:

1. A memory device comprising:
a plurality of non-volatile semiconductor memories; and
a device controller that is coupled to the plurality of non-volatile semiconductor memories and coupled to a host apparatus which is configured to issue an instruction for accessing the plurality of non-volatile semiconductor memories,
each of the plurality of non-volatile semiconductor memories including a plurality of storage circuits and a plurality of control circuits,
the plurality of storage circuits being coupled to the device controller via the plurality of control circuits, respectively,
each of the plurality of storage circuits including a plurality of blocks;
each block being a unit of erasure of data,
each of the plurality of blocks including a plurality of pages,
each page being a unit of read and write of data, and
the device controller being configured to, when the device controller reads data stored in a specific page in the plurality of non-volatile semiconductor memories to detect an uncorrectable error (UE) of the data stored in the specific page, execute a diagnosis process including specifying a specific storage circuit that is a storage circuit including the specific page, reading data stored in a block in a part of the specific storage circuit, and specifying, on the basis of a result of reading the data stored in the block in the part, a failure region in the specific storage circuit.

2. The memory device according to claim 1, wherein the device controller is configured to accept an I/O request for designating a logical address from the host apparatus, convert the logical address into a physical address indicating a location in the plurality of non-volatile semiconductor memories, and execute an I/O on the physical address on the basis of the I/O request, and
the device controller is configured to notify the host apparatus of failure information indicating a logical address corresponding to the failure region.

3. The memory device according to claim 2, wherein the device controller is configured to specify a specific block that is a block including the specific page, read data stored in the specific block, determine whether or not a result of reading data stored in the specific block satisfies a predetermined distribution condition, and determine that the specific block is the failure region when it is determined that the result of reading data stored in the specific block does not satisfy the distribution condition.

4. The memory device according to claim 3, wherein the device controller is configured to, when it is determined that the result of reading data stored in the specific block satisfies the distribution condition, select, as a selected block, a block in a part of the specific storage circuit, to read data stored in the selected block, and determine on the basis of the result of reading data stored in the selected block whether or not the specific storage circuit is the failure region.

5. The memory device according to claim 4, wherein the device controller is configured to, when each of L selected blocks satisfies a predetermined selection condition and a UE is detected as a result of reading data stored in each of the L selected blocks, determine that the specific storage circuit is the failure region, and
L is equal to or larger than 2 and less than the number of the plurality of blocks.

6. The memory device according to claim 5, wherein a block that satisfies the selection condition includes a block over the whole of which is written with data.

7. The memory device according to claim 6, wherein each of the plurality of non-volatile semiconductor memories includes a plurality of semiconductor substrates,
each of the plurality of semiconductor substrates includes the plurality of storage circuits and the plurality of control circuits and
in the diagnosis process, the device controller is configured to specify a semiconductor substrate including the specific storage circuit, as a specific semiconductor substrate, when it is determined that the specific storage circuit is the failure region, select, as an additional storage circuit, another storage circuit in the specific semiconductor substrate, select, as an additional block, a block in a part of the additional storage circuit, to read data stored in the additional block, and determine on the basis of a result of reading data stored in the additional block whether or not the additional storage circuit is the failure region to specify a failure region in the specific semiconductor substrate.

8. The memory device according to claim 7, wherein the device controller is configured to, when a UE is detected as a result of reading in response to a read request from the host apparatus during the diagnosis process and a logical address designated by the read request corresponds to a physical address in the specific semiconductor substrate, notify the host apparatus of a response for requesting to not count the UE on the basis of the read request.

9. The memory device according to claim 3, wherein each of the plurality of blocks includes a plurality of page rows arranged in a two-dimensionally arranged column direction,
each of the plurality of page rows includes a plurality of pages coupled in a row direction,
each of the plurality of pages includes a plurality of memory cells coupled in the row direction,
each memory cell is a circuit which stores data, and
the device controller is configured to, when a location of the UE detected as a result of reading data stored in the specific block is distributed over a range wider than respectively adjacent two page rows, determine that the result of reading the data stored in the specific block satisfies the distribution condition.

10. The memory device according to claim 2, wherein the device controller is configured to, when accepting a request from the host apparatus after specifying the failure region, notify the host apparatus of a response to the request and a result of the specified failure region.

11. A storage apparatus comprising:
a plurality of memory devices; and
a storage controller that is coupled to the plurality of memory devices,
the plurality of memory devices including:
a plurality of non-volatile semiconductor memories; and
a device controller that is coupled to the plurality of non-volatile semiconductor memories and the storage controller,
each of the plurality of non-volatile semiconductor memories including a plurality of storage circuits and a plurality of control circuits,
the plurality of storage circuits being coupled to the device controller via the plurality of control circuits, respectively, each of the plurality of storage circuits including a plurality of blocks;

each block being a unit of erasure of data, each of the plurality of blocks including a plurality of pages, each page being a unit of read and write of data, and the device controller being configured to, when the device controller reads data stored in a specific page in the plurality of non-volatile semiconductor memories to detect an uncorrectable error (UE) of the data stored in the specific page, execute a diagnosis process including specifying a specific storage circuit that is a storage circuit including the specific page, reading data stored in a block in a part of the specific storage circuit, and specifying, on the basis of a result of reading the data stored in the block in the part, a failure region in the specific storage circuit.

12. The storage apparatus according to claim 11, wherein the device controller is configured to accept an I/O request for designating a logical address from the storage controller, convert the logical address into a physical address indicating a location in the plurality of non-volatile semiconductor memories, and execute an I/O on the physical address on the basis of the I/O request; and the device controller is configured to notify the storage controller of failure information indicating a logical address corresponding to the failure region.

13. The storage apparatus according to claim 12, wherein the storage controller is configured to construct a RAID group including the plurality of memory devices; and the storage controller is configured to, when accepting the failure information from the memory device, restore data stored in the failure region on the basis of the RAID group.

14. The storage apparatus according to claim 13, wherein the storage controller is configured to, when accepting the failure information from the memory device, reduce, on the basis of the failure information, a capacity of a logical storage area of the memory device.

* * * * *